United States Patent
Ohori et al.

(10) Patent No.: US 10,664,554 B2
(45) Date of Patent: May 26, 2020

(54) MEASUREMENT APPARATUS AND DATA PROCESSING METHOD

(71) Applicant: DAIHEN Corporation, Osaka-shi, Osaka (JP)

(72) Inventors: Akihiro Ohori, Osaka (JP); Nobuyuki Hattori, Osaka (JP)

(73) Assignee: DAIHEN Corporation, Osaka (JP)

( * ) Notice: Subject to any disclaimer, the term of this patent is extended or adjusted under 35 U.S.C. 154(b) by 0 days.

(21) Appl. No.: 16/176,156

(22) Filed: Oct. 31, 2018

(65) Prior Publication Data

US 2019/0065439 A1 Feb. 28, 2019

Related U.S. Application Data

(62) Division of application No. 14/630,942, filed on Feb. 25, 2015, now Pat. No. 10,162,801.

(30) Foreign Application Priority Data

Mar. 3, 2014 (JP) .................................. 2014-040696
May 9, 2014 (JP) .................................. 2014-097479

(51) Int. Cl.
*G06F 17/18* (2006.01)
*G01R 21/133* (2006.01)
*G01R 19/02* (2006.01)

(52) U.S. Cl.
CPC ............. *G06F 17/18* (2013.01); *G01R 19/02* (2013.01); *G01R 21/133* (2013.01)

(58) Field of Classification Search
CPC .................................. G06F 17/18; G01R 19/02
See application file for complete search history.

(56) References Cited

U.S. PATENT DOCUMENTS

2010/0301837 A1   12/2010   Higuma et al.
2012/0218790 A1    8/2012   Sato et al.
(Continued)

FOREIGN PATENT DOCUMENTS

JP       11-125649 A       5/1999
JP       2001-14582 A      1/2001
JP       2012-235658 A    11/2012

OTHER PUBLICATIONS

Olfati-Saber et al. "Consensus and Cooperation in Networked Multi-Agent Systems", Proceedings of the IEEE, vol. 95, No. 1, pp. 215-233 (2007).

(Continued)

*Primary Examiner* — Stephen W Smoot
(74) *Attorney, Agent, or Firm* — Hamre, Schumann, Mueller & Larson, P.C.

(57) ABSTRACT

A measurement apparatus is used in cooperation with another equivalent measurement apparatus. Each measurement apparatus includes a change amount calculator for calculating a change amount of measured values, an average value generator for generating a first internal average value based on the change amount, and a communication unit for receiving a second internal average value that was generated by at least one other measurement apparatus. The average value generator generates a third internal average value, using a computation result based on at least the first and second internal average values.

19 Claims, 23 Drawing Sheets

(56) References Cited

U.S. PATENT DOCUMENTS

2013/0271055 A1\* 10/2013 Xu .......................... H02P 27/06
　　　　　　　　　　　　　　　　　　　　　　　　　　318/503
2014/0278234 A1    9/2014 Chang et al.
2017/0214808 A1\*  7/2017 Yun .......................... G06F 3/12

OTHER PUBLICATIONS

Office Action issued in corresponding Japanese Patent Application, dated Nov. 14, 2017 (2 pages).

\* cited by examiner (b)

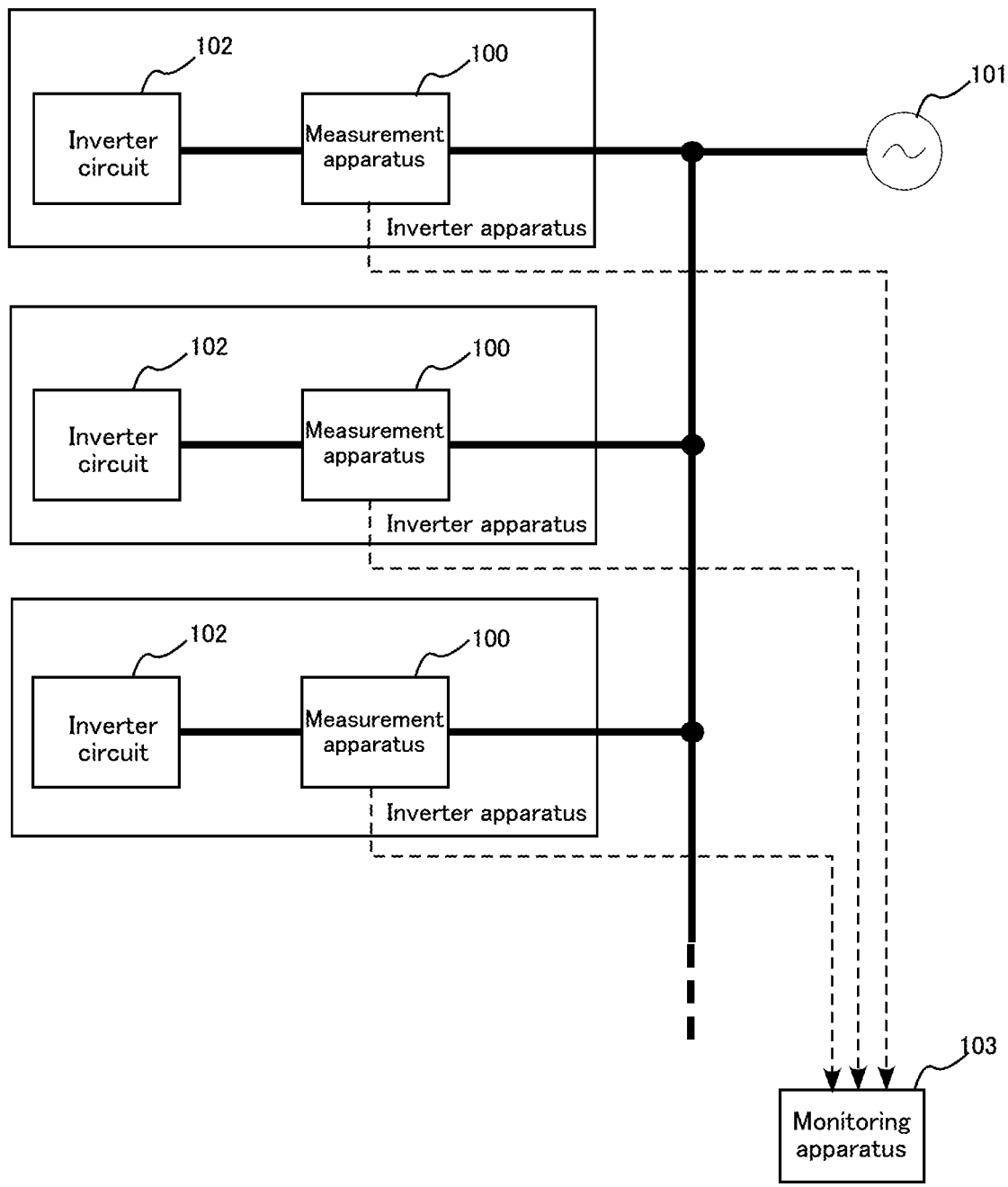
FIG.23 - PRIOR ART ously measured values in said solar cells, and temperatures
MEASUREMENT APPARATUS AND DATA PROCESSING METHOD

BACKGROUND OF THE INVENTION

1. Field of the Invention

The present invention relates to a technique for calculating, based on measured values measured at a plurality of positions, a desired value (for example, an average value, a maximum value, and a minimum value). The present invention particularly relates to a measurement apparatus and a calculation method that are for calculating such a desired value. Furthermore, the present invention relates to a malfunction detection apparatus and a malfunction detection method that use such a measurement apparatus.

2. Description of Related Art

In solar power plants and wind power plants, several dozens to hundreds of inverter apparatuses are connected to an electric power system in parallel. FIG. 23 is a diagram illustrating a conventional solar power plant. As shown in the drawing, a plurality of inverter apparatuses are connected to an electric power system 101. Each inverter apparatus includes a measurement apparatus 100 and an inverter circuit 102. Measured Values obtained by the measurement apparatuses 100 are input into a monitoring apparatus 103. The monitoring apparatus 103 monitors the operational states of the inverter apparatuses (see, for example, Patent Document 1 below).

Examples of the measured values that are input into the monitoring apparatus 103 include output active powers, output reactive powers, output voltages, and output currents of the inverter circuits 102. Furthermore, other examples include input powers, input voltages, and input currents that are input into the inverter circuits 102 from solar cells, an amount of solar radiation on the solar cells, and temperatures of the solar cells. In FIG. 23, the measurement apparatuses 100 are arranged on the output side of the inverter circuits 102, and are configured to measure an output active power. The monitoring apparatus 103 can calculate the maximum value or minimum value of measured values input from the measurement apparatuses 100, or calculate the average value of these measured values.

Ordinarily, in solar power plants, a large number of inverter apparatuses are installed in a scattered manner in a broad ground. The measurement apparatus provided in each inverter apparatus can be used to recognize a measured value in this inverter apparatus, but cannot be used to recognize measured values in other inverter apparatuses. Therefore, it is not possible to recognize, using the measurement apparatus of one inverter apparatus, the average value of all measured values or the maximum value or minimum value of the measured values.

LITERATURE LIST

Patent Document 1: JP-A-2012-235658
Non-Patent Document 1: Reza Olfati-Saber, J. Alex Fax, and Richard M. Murray, "Consensus and Cooperation in Networked Multi-Agent Systems", Proceedings of the IEEE, Vol. 95, No. 1, (2007)
Non-Patent Document 2: Mehran Mesbahi and Magnus Egerstedt, "Graph Theoretic Methods in Multiagent Networks", Princeton (2010)

SUMMARY OF THE INVENTION

The present invention was proposed in view of the above-described circumstances. It is thus an object of the present invention to provide a technique for calculating the average value, the maximum value, or the minimum value of measured values without collecting all the measured values at one place.

According to a first aspect of the present invention, a measurement apparatus that cooperates with at least one other measurement apparatus is provided. This measurement apparatus includes: a change amount calculator for calculating a change amount of measured values; an average value generator for generating a first internal average value based on the change amount; and a communication unit for receiving a second internal average value that was generated by the at least one other measurement apparatus. The average value generator is configured to generate a third internal average value using a computation result based on at least the first and second internal average values.

According to a second aspect of the present invention, a data processing method for processing data based on measured values measured by a plurality of measurement apparatuses arranged at a plurality of positions is provided. In this method, each of the plurality of measurement apparatuses performs the following steps. That is, they are the steps of: calculating a change amount of measured values; generating an internal average value based on the change amount; transmitting the generated internal average value to at least one other measurement apparatus; receiving the internal average value transmitted by the at least one other measurement apparatus; and generating a new internal average value using a computation result based on the generated internal average value and the received internal average value.

According to a third aspect of the present invention, a measurement apparatus that cooperates with at least one other measurement apparatus is provided. This measurement apparatus includes: an internal value generator for generating a first internal value based on a measured value; and a communication unit for receiving a second internal value generated by the at least one other measurement apparatus. The internal value generator is configured to generate a third internal value, based on at least one of the first internal value, the second internal value, and the measured value. If the measured value is not varied, the first internal value and the second internal value are used for the generation of the third internal value, whereas if the measured value is varied to another measured value, at least the other measured value is used for the generation of the third internal value.

According to a fourth aspect of the present invention, a calculation method for calculating a maximum value or minimum value of measured values measured by a plurality of measurement apparatuses arranged at a plurality of positions is provided. In this method, each of the plurality of measurement apparatuses performs the following steps. That is, they are the steps of: generating a first internal value based on a measured value; transmitting the first internal value to at least one other measurement apparatus; receiving a second internal value transmitted by the at least one other measurement apparatus; and generating a third internal value, based on at least one of the first internal value, the second internal value, and the measured value. If the measured value is not varied, the first internal value and the second internal value are used for the generation of the third internal value, and if the measured value is varied to another measured value, at least the other measured value is used for the generation of the third internal value.

Other features and advantages of the present invention will become more apparent by the detailed description that will be made below with reference to the accompanying drawings.

BRIEF DESCRIPTION OF THE DRAWINGS

FIG. 23 is a diagram illustrating a conventional solar power plant.

DESCRIPTION OF THE PREFERRED EMBODIMENTS

Hereinafter, embodiments according to a first aspect of the present invention will be described. In the following embodiments, a measurement apparatus is used as an apparatus for measuring an output active power, but the present invention is not limited to this.

Figure 1:
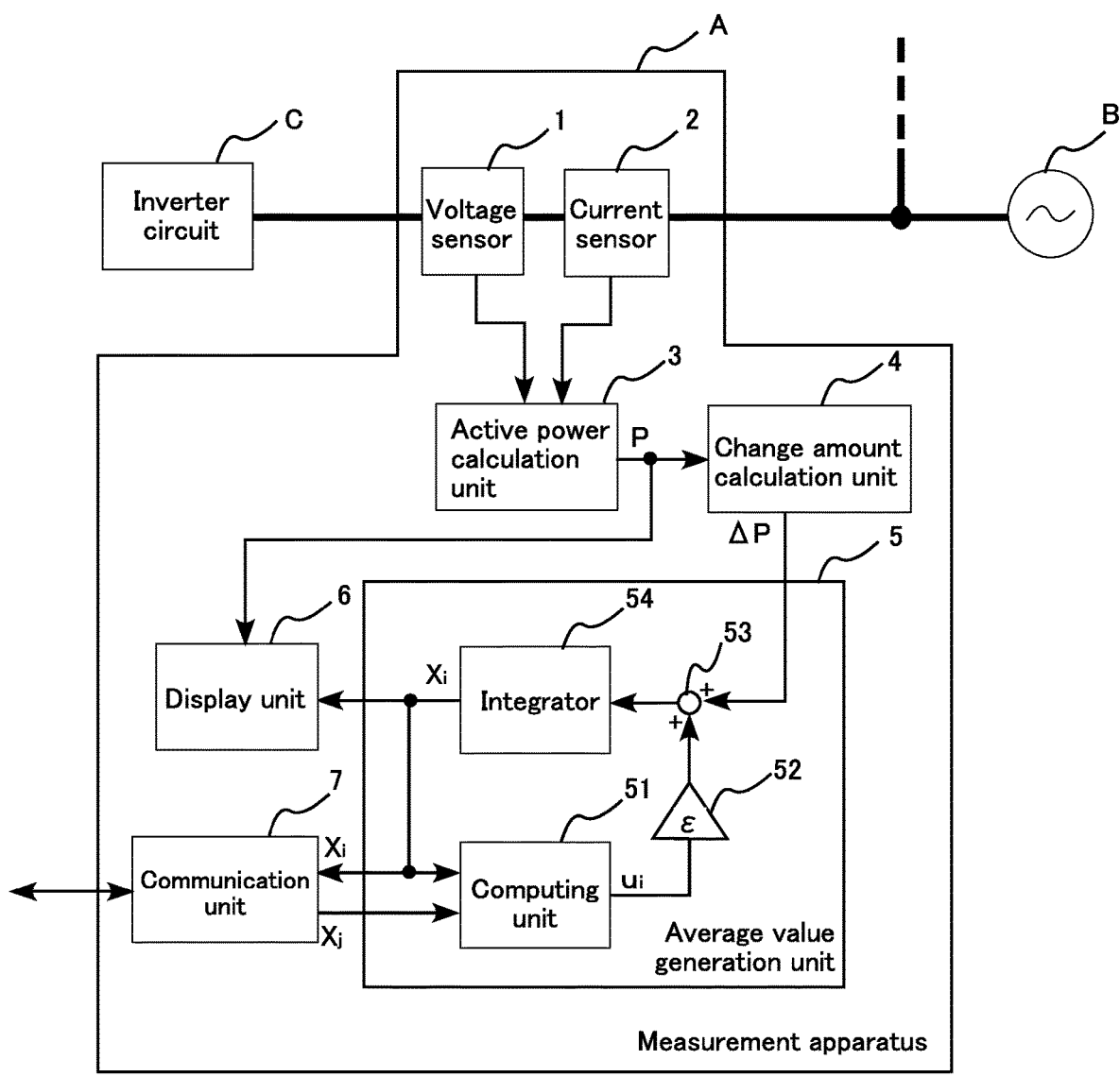
FIG. 1 is a diagram illustrating a measurement apparatus according to a first embodiment of a first aspect of the present invention.
Figure 2:
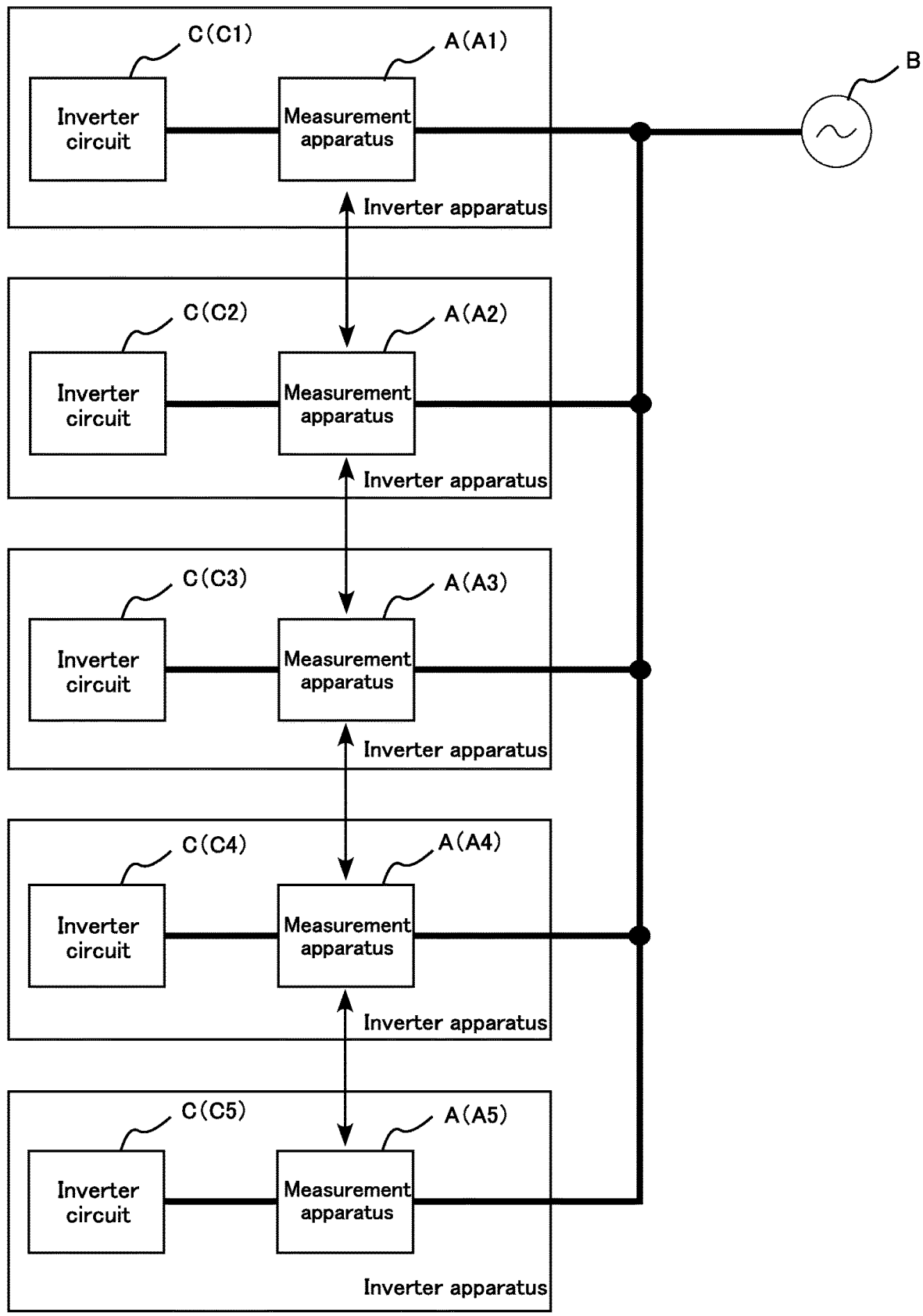
FIG. 2 is a diagram showing a solar power plant in which a plurality of inverter apparatuses are connected in parallel.

FIG. 1 is a diagram illustrating a measurement apparatus A according to a first embodiment of the first aspect. Inside an inverter apparatus connected to an electric power system B, the measurement apparatus A is arranged on the output side of an inverter circuit C. FIG. 2 is a diagram showing a solar power plant in which a plurality of inverter apparatuses are connected in parallel, and shows the state in which the measurement apparatuses A that are provided in the respective inverter apparatuses perform communication.

Each inverter circuit C converts a direct-current power input from a solar cell (illustration thereof is omitted) into an alternating-current power, and outputs the converted alternating-current power to the electric power system B. The measurement apparatus A measures an output active power of the inverter circuit C. The shown inverter apparatus may be, for example, a power conditioner, and may include, in addition to the inverter circuit C and the measurement apparatus A, a control circuit that controls the inverter circuit C, and various types of protection equipment.

As shown in FIG. 1, the measurement apparatus A is provided with a voltage sensor 1, a current sensor 2, an active power calculation unit 3, a change amount calculation unit 4, an average value generation unit 5, a display unit 6, and a communication unit 7. The measurement apparatus A calculates an active power P that is output by the inverter circuit C based on a voltage signal detected by the voltage sensor 1 and a current signal detected by the current sensor 2.

The voltage sensor 1 is arranged on an output line of the inverter circuit C, and detects the instantaneous value of a voltage at the position at which the voltage sensor 1 is arranged. The voltage sensor 1 converts the detected instantaneous value into a digital value, and outputs the digital value as a voltage signal to the active power calculation unit 3. The current sensor 2 is arranged on the output line of the inverter circuit C, and detects the instantaneous value of a current at the position at which the current sensor 2 is arranged. The current sensor 2 converts the detected instantaneous value into a digital value, and outputs the digital value as a current signal to the active power calculation unit 3.

The active power calculation unit 3 calculates an active power P based on the voltage signal input from the voltage sensor 1 and the current signal input from the current sensor 2. The active power calculation unit 3 updates the calculated active power P at a predetermined timing (for example, with an interval of 1 second), and outputs the updated and calculated active power P to the change amount calculation unit 4 and the display unit 6.

Figure 3:
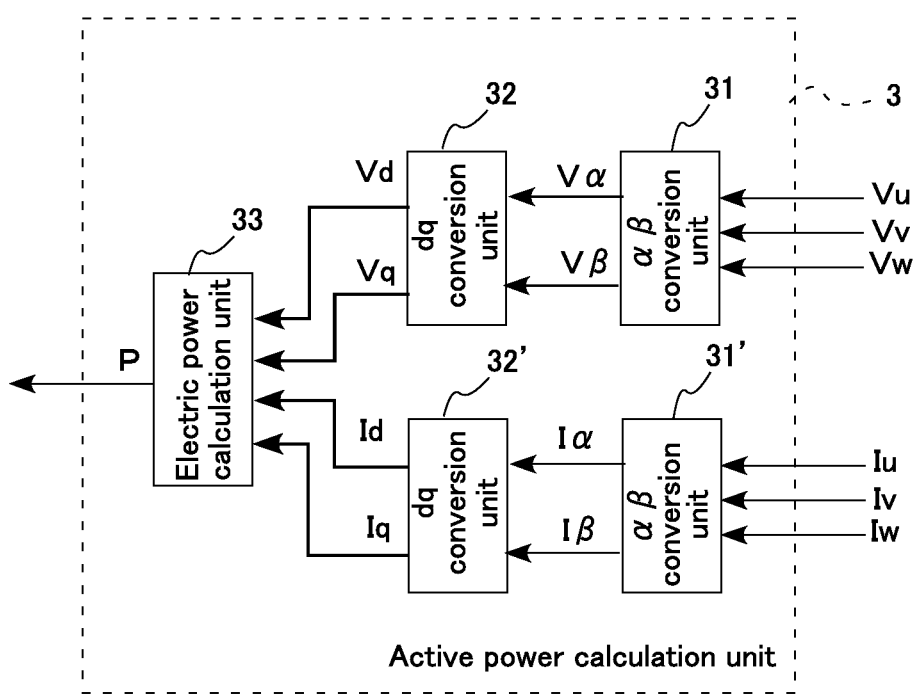
FIG. 3 is a diagram showing an example of the internal configuration of an active power calculation unit.

FIG. 3 is a diagram showing an example of the internal configuration of the active power calculation unit 3.

The active power calculation unit 3 calculates an active power P based on three-phase voltage signals and three-phase current signals, and is provided with αβ conversion units 31 and 31', dq conversion units 32 and 32', and an electric power calculation unit 33.

The αβ conversion unit 31 converts three-phase voltage signals Vu, Vv, and Vw that are input from the voltage sensor 1 into two-phase voltage signals Vα and Vβ. Upon input of the voltage signals Vα and Vβ from the αβ conversion unit 31, the dq conversion unit 32 calculates an in-phase component Vd and a phase-difference component Vq. The αβ conversion unit 31' converts three-phase current signals Iu, Iv, and Iw that are input from the current sensor 2 into two-phase current signals Iα and Iβ. Upon input of the current signals Iα and Iβ from the αβ conversion unit 31', the dq conversion unit 32' calculates an in-phase component Id and a phase-difference component Iq.

The electric power calculation unit 33 calculates an active power P based on the following formula (1), using the in-phase component Vd and the phase-difference component Vq that are input from the dq conversion unit 32 and the in-phase component Id and the phase-difference component Iq that are input from the dq conversion unit 32'. The electric power calculation unit 33 calculates, at a predetermined timing, an average value in a period from the previous timing to the current timing, and outputs the calculated average value as an active power P.

$$P = Vd \cdot Id + Vq \cdot Iq \tag{1}$$

Note that the active power calculation unit 3 shown in FIG. 3 is merely an example, and the present invention is not limited to this. For example, an active power P may also be calculated based on the voltage signals Vα and Vβ and the current signals Iα and Iβ, or based on the voltage signals Vu, Vv, and Vw and the current signals Iu, Iv, and Iw. Furthermore, an active power P may also be calculated based on effective values of a voltage and a current, and a phase difference between the voltage and the current.

The change amount calculation unit 4 calculates a change amount ΔP of the active powers P that are input from the active power calculation unit 3. While the active power P input from the active power calculation unit 3 has not been updated, the change amount calculation unit 4 calculates the change amount ΔP as "0", whereas when the active power P has been updated, the change amount calculation unit 4 calculates a difference between the active power P after updating and the active power P before updating, as the change amount ΔP. The change amount calculation unit 4 outputs the change amount ΔP to the average value generation unit 5.

The average value generation unit 5 generates an internal average value $X_i$ of active powers P calculated by the corresponding measurement apparatus A. The internal average value $X_i$ is an arithmetic average value of active powers P calculated by each measurement apparatus A, the internal average value $X_i$ being provisionally calculated inside the measurement apparatus A. As will be described later, the internal average values $X_i$ of the respective measurement apparatuses A converge to the arithmetic average value of the active powers P calculated by the measurement apparatuses A, by computation processing of the average value generation unit 5 being repeatedly performed. The average value generation unit 5 outputs the generated internal average values $X_i$ to the display unit 6 and the communication unit 7. The detail of the average value generation unit 5 will be described later.

The display unit 6 displays measured values, and displays an active powers P input from the active power calculation unit 3 as an output active power of the inverter circuit C. Furthermore, the display unit 6 displays the internal average value $X_i$ input from the average value generation unit 5 as an average value of output active powers of the inverter apparatuses installed in the power plant. Furthermore, the display unit 6 displays a value $n \cdot X_i$ calculated by multiplying the internal average value $X_i$ by the number n of the inverter apparatuses installed in the power plant as the sum total of the output active powers of the entire power plant.

The communication unit 7 communicates with another measurement apparatus A. Upon input of an internal average value $X_i$ generated by the average value generation unit 5, the communication unit 7 transmits the input internal average value $X_i$ to the communication unit 7 of the other measurement apparatus A. Furthermore, the communication unit 7 outputs an internal average value $X_j$ received from the communication unit 7 of another measurement apparatus A to the average value generation unit 5. Note that the communication method may be, for example, wired communication or wireless communication.

As shown in FIG. 2, each measurement apparatus A is arranged on the output side of the inverter circuit C inside the corresponding inverter apparatus that is connected to the electric power system B. FIG. 2 shows, for ease of illustration, the state in which five inverter apparatuses are connected to the electric power system B, but actually, a larger number of inverter apparatuses are used.

The arrows shown in FIG. 2 indicate that the measurement apparatuses A communicate with each other. A measurement apparatus A1 mutually communicates only with a measurement apparatus A2, and the measurement apparatus A2 mutually communicates only with the measurement apparatus A1 and a measurement apparatus A3. Furthermore, the measurement apparatus A3 mutually communicates only with the measurement apparatus A2 and a measurement apparatus A4, the measurement apparatus A4 mutually communicates only with the measurement apparatus A3 and a measurement apparatus A5, and the measurement apparatus A5 mutually communicates only with the measurement apparatus A4. Accordingly, a measurement apparatus A communicates with at least one of the measurement apparatuses A provided in the inverter apparatuses installed in the power plant, and the state ("coupled state") is realized in which a communication paths between two arbitrary measurement apparatuses A exists. If such a coupled state is realized, each measurement apparatus A does not need to communicate with all other measurement apparatuses A.

For example, in the case of the measurement apparatus A2, the communication unit 7 transmits an internal average value $X_2$ generated by the average value generation unit 5 to the communication units 7 of the measurement apparatuses A1 and A3, and receives an internal average value $X_1$ from the communication unit 7 of the measurement apparatus A1 and an internal average value $X_3$ from the communication unit 7 of the measurement apparatus A3.

Hereinafter, the detail of the average value generation unit 5 will be described.

The average value generation unit 5 generates an internal average value $X_i$, using the generated internal average value $X_i$ and an internal average value $X_j$ of another measurement apparatus A that is input from the communication unit 7. Even if the internal average value $X_i$ and the internal average value $X_j$ are different from each other, the internal average value $X_i$ and the internal average value $X_j$ converge to a common value by computation processing being repeatedly performed by the average value generation unit 5. As shown in FIG. 1, the average value generation unit 5 is provided with a computing unit 51, a multiplier 52, an adder 53, and an integrator 54.

The computing unit 51 performs computation based on the following formula (2). That is, the computing unit 51 outputs, to the multiplier 52, a computation result $u_i$ that is obtained by subtracting the internal average value $X_i$ generated by the average value generation unit 5 from each of internal average values $X_j$ that are input from the communication unit 7 and summing up all the subtraction results.

$$u_i = \sum_j (X_j - X_i) \quad (2)$$

For example, in the case of the measurement apparatus A2 (see FIG. 2), the computing unit 51 performs computation based on the following formula (3) and outputs the computation result $u_2$.

$$\begin{aligned} u_2 &= \sum_{j=1,3} (X_j - X_2) \\ &= (X_1 - X_2) + (X_3 - X_2) \\ &= X_1 + X_3 - 2X_2 \end{aligned} \quad (3)$$

The multiplier 52 multiplies the computation result $u_i$ input from the computing unit 51 by a predetermined coefficient ε, and output the product to the adder 53. The coefficient ε is a value that satisfies $0<ε<1/d_{max}$ and is preset. $d_{max}$ is determined in the following manner. The number of other measurement apparatuses A with which the communication unit 7 of a measurement apparatus $A_i$ (i=1, 2, 3, . . . , n) communicates is $d_i$ (in the example shown in FIG. 2, $d_1$=1 and $d_2$=2). The maximum value of such $d_i$ (i=1, 2, 3, . . . , n) is defined as $d_{max}$. That is, the maximum value is the number of the internal average values $X_j$ that are input into the communication unit 7 of the measurement apparatus that communicates with the largest number of other measurement apparatuses A, among the measurement apparatuses A. Note that the coefficient ε is used for multiplication of the computation result $u_i$ that is to suppress an excessively variation in the internal average values $X_i$. Therefore, if processing by the average value generation unit 5 is continuous time processing, there will be no need to provide the multiplier 52.

The adder 53 adds the change amount ΔP input from the change amount calculation unit 4 to the input from the multiplier 52, and outputs the sum to the integrator 54. While the active power P has not been updated, the change amount ΔP is "0", and thus the input from the multiplier 52 is directly output to the integrator 54. On the other hand, when the active power P has been updated, the change amount ΔP between the active power P before updating and the active power P after updating is added to the input from the multiplier 52, and the sum is output to the integrator 54. The integrator 54 integrates the value input from the adder 53 (that is, adds the value input from the adder 53 to a previously generated internal average value $X_i$) and thereby generates and outputs an internal average value $X_i$. The internal average value $X_i$ is output to the display unit 6, the communication unit 7, and the computing unit 51.

In the present embodiment, the average value generation unit 5 generates an internal average value $X_i$, using the generated internal average value $X_i$ and an internal average value $X_j$ of another measurement apparatus A that is input from the communication unit 7. If the internal average value $X_i$ is larger than the arithmetic average value of internal average values $X_j$, the computation result $u_i$ that is output by the computing unit 51 will be a negative value. Accordingly, the internal average value $X_i$ that is output from the integrator 54 will decrease. On the other hand, if the internal average value $X_i$ is smaller than the arithmetic average value of internal average values $X_j$, the computation result $u_i$ that is output by the computing unit 51 will be a positive value. Therefore, the internal average value $X_i$ that is output from the integrator 54 will increase. That is, the internal average value $X_i$ is approximated to the arithmetic average value of the internal average values $X_j$. This processing is performed in each measurement apparatus A, and thereby the internal average values $X_i$ of the respective measurement apparatuses A converge to the same value Xα. The fact that the internal average values $X_i$ converge to the same value is also mathematically proofed (see Non-Patent Documents 1 and 2). Furthermore, the fact that, as indicated by the following formula (4), the convergence value Xα is the arithmetic average value of initial values of the internal average values $X_i$ of the measurement apparatuses A is also proofed. n refers to the number of the inverter apparatuses installed in an power plant (that is, the number of the measurement apparatuses A), and the following formula (4) indicates that an arithmetic average value is calculated by summing up the initial values of internal average values $X_1$ to $X_n$ of the measurement apparatuses A1 to An and dividing the sum by n.

$$X_\alpha = \frac{1}{n}\sum_{i=1}^{n} X_i(0) \quad (4)$$

The initial value is updated when the active power P of any one of the measurement apparatuses A is updated. In the measurement apparatus A in which the active power P has been updated, the internal average value $X_i$ to which the change amount ΔP is added by the adder 53 serves as the updated initial value, and in the measurement apparatus A in which the active power P has not been updated, the internal average value $X_i$ at that time directly serves as the initial value. Note that the change amount ΔP that is output by the change amount calculation unit 4 may be added to the output of the integrator 54, instead of being added by the adder 53.

Figure 4:
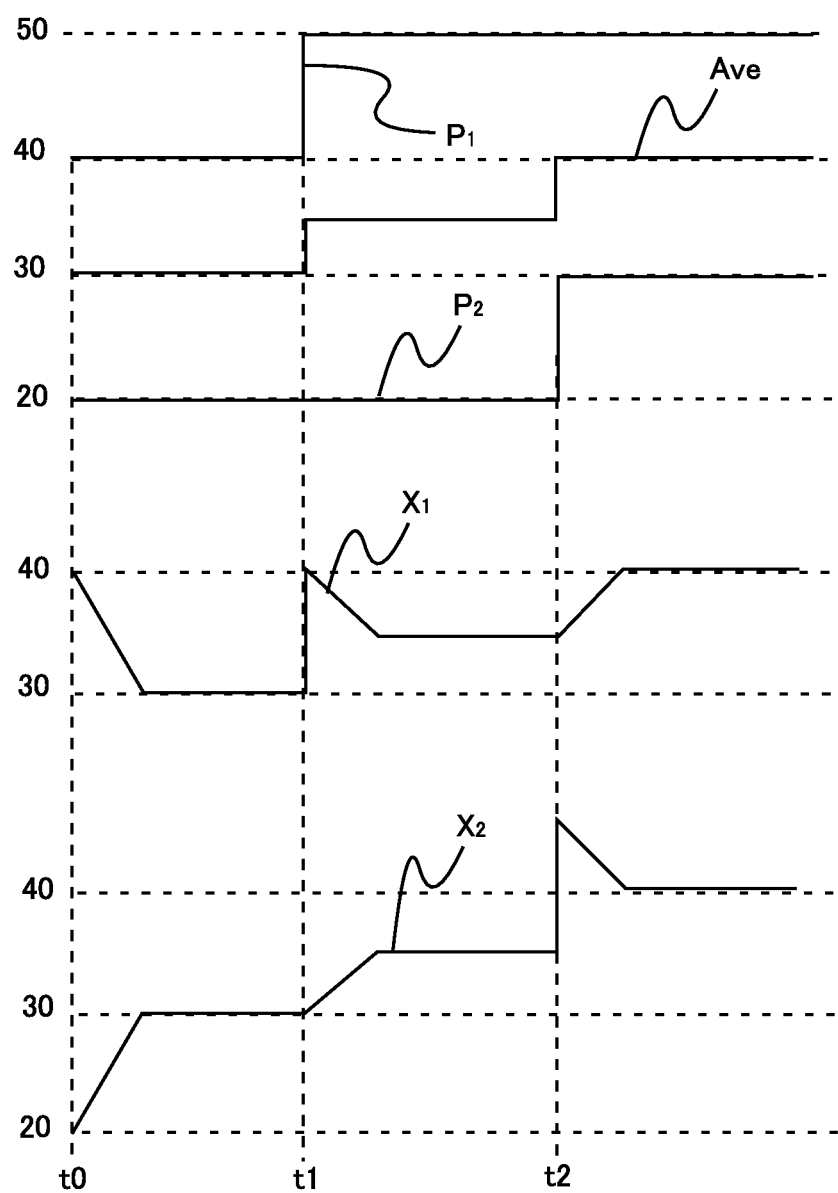
FIG. 4 is a diagram illustrating updating of initial values by updating measured active powers, and convergence of the initial values to an arithmetic average value.

FIG. 4 is a diagram illustrating updating of initial values by updating active powers P, and convergence of the initial values to an arithmetic average value.

FIG. 4 illustrates the case in which the arithmetic average value of two measurement apparatuses A1 and A2 is calculated. The illustration is given assuming that the active powers P measured by the measurement apparatuses A1 and A2 are respectively defined as $P_1$ and $P_2$, and the internal average values generated by the average value generation units 5 of the measurement apparatuses A1 and A2 are respectively defined as $X_1$ and $X_2$. Furthermore, the theoretical arithmetic average value of $P_1$ and $P_2$ is indicated as Ave. $P_1$ is "40" from time t0 to time t1 and is "50" after time t1, and $P_2$ is "20" from the t0 to time t2 and is "30" after time t2. The theoretical arithmetic average value Ave is "30" from time t0 to time t1, is "35" from time t1 to time t2, and is "40" after time t2.

$X_1$ and $X_2$ are respectively "40" and "20" at time t0, but converge to the arithmetic average value "30". Then, since $P_1$ is updated from "40" to "50" at time t1, $X_1$ is incremented by "10" to become "40", and $X_2$ remains at "30". These values serve as initial values and $X_1$ and $X_2$ converge to the arithmetic average value "35". Then, since $P_2$ is updated from "20" to "30" at time t2, $X_2$ is incremented by "10" to become "45", and $X_1$ remains at "35". These values serve as initial values, and $X_1$ and $X_2$ converge to the arithmetic average value "40".

The following will describe simulation showing that arithmetic average values are calculated in the measurement apparatuses A1 to A5 shown in FIG. 2.

Figure 5A:
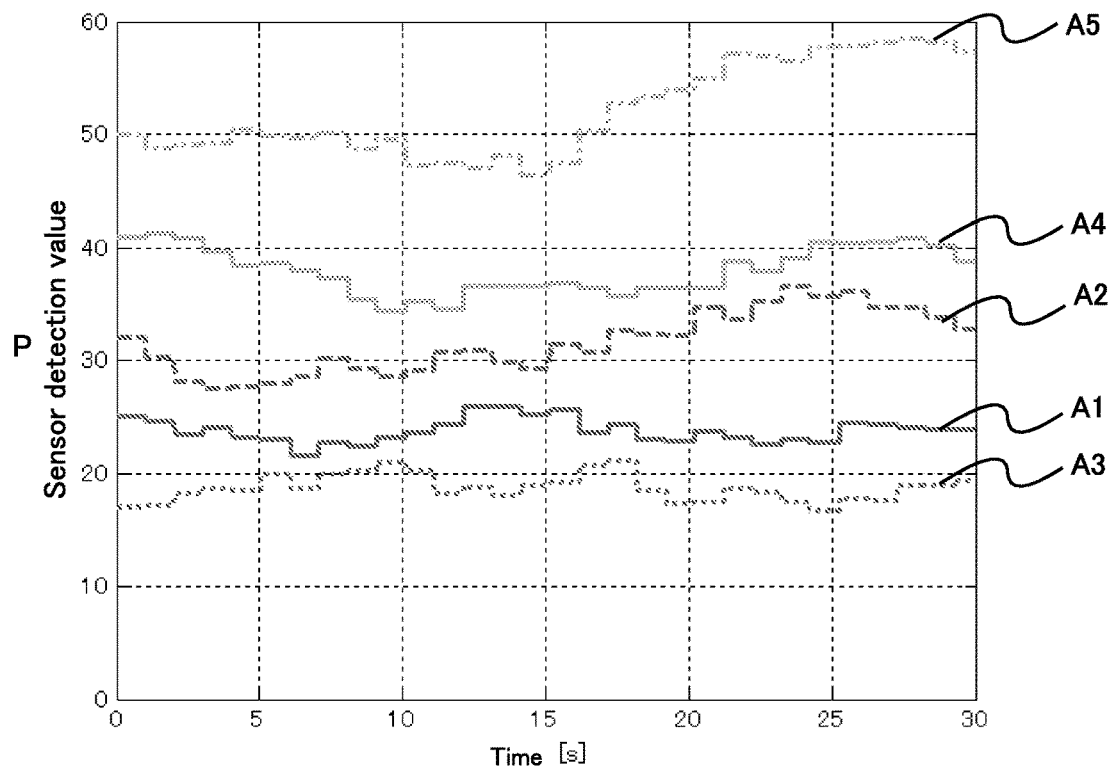
FIGS. 5A and 5B are diagrams showing simulation for recognizing that an arithmetic average value is calculated in each measurement apparatus.
Figure 5B:
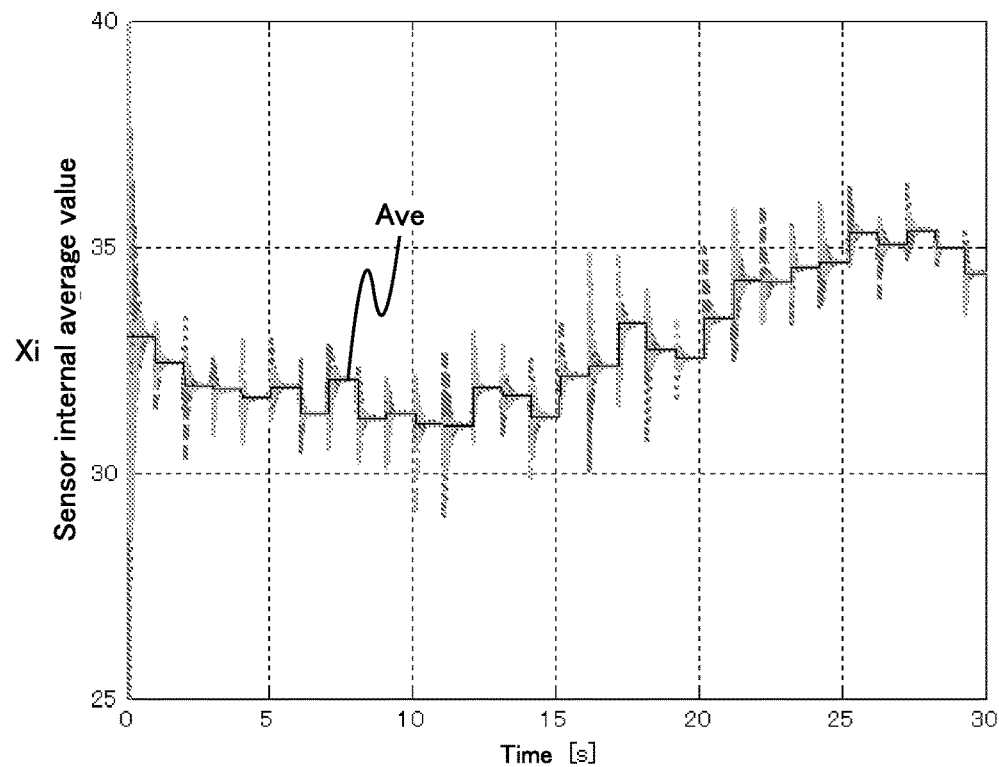

FIGS. 5A and 5B are diagrams illustrating this simulation. FIG. 5A shows the time variation of the active powers P (that is, the measured values) that are output by the active power calculation units 3 of the measurement apparatuses A1 to A5. Each measured value is varied, using a random number, for each second in a random manner. Furthermore, the communication cycle by the communication unit 7 is 10 milliseconds.

FIG. 5B shows the time variation of the internal average values $X_i$ that are output by the average value generation units 5 of the measurement apparatuses A1 to A5. The solid line Ave indicates the theoretical arithmetic average value of the measured values. As shown in the drawing, it is recognizable that, at the time of updating of a measured value, the internal average values $X_i$ of the measurement apparatuses A1 to A5 vary transiently but converge to the theoretical arithmetic average value. If the display unit 6 is configured to display the internal average values $X_i$ only after the stationary state is realized (for example, after 0.5 second or the like since the measured value was updated), the arithmetic average value of the entire system can be displayed.

According to the present embodiment, the measurement apparatus A included in each of the inverter apparatuses mutually communicates with at least one of the measurement apparatuses A (for example, a measurement apparatus that is located in the vicinity thereof or with which communication has been established), and the communication state of the measurement apparatuses A is the coupled state. Accordingly, the internal average values $X_i$ of all the measurement apparatuses A converge to a convergence value $X\alpha$. The convergence value $X\alpha$ is an arithmetic average value of the initial values of the internal average values $X_i$ of the measurement apparatuses A. Furthermore, the initial value is updated when the active power P is updated by the change amount $\Delta P$ thereof being added to the internal average value $X_i$. Therefore, the internal average value $X_i$ is the arithmetic average value of the active powers P of the measurement apparatuses A. The display unit 6 displays the internal average value $X_i$ and the sum total $n \cdot X_i$. Accordingly, it is possible to recognize, in each measurement apparatus A, the sum total or the arithmetic average value of the output active powers of the entire power plant, without using the monitoring apparatus 103 (see FIG. 23) that collects measured values of the measurement apparatuses.

Figure 6:
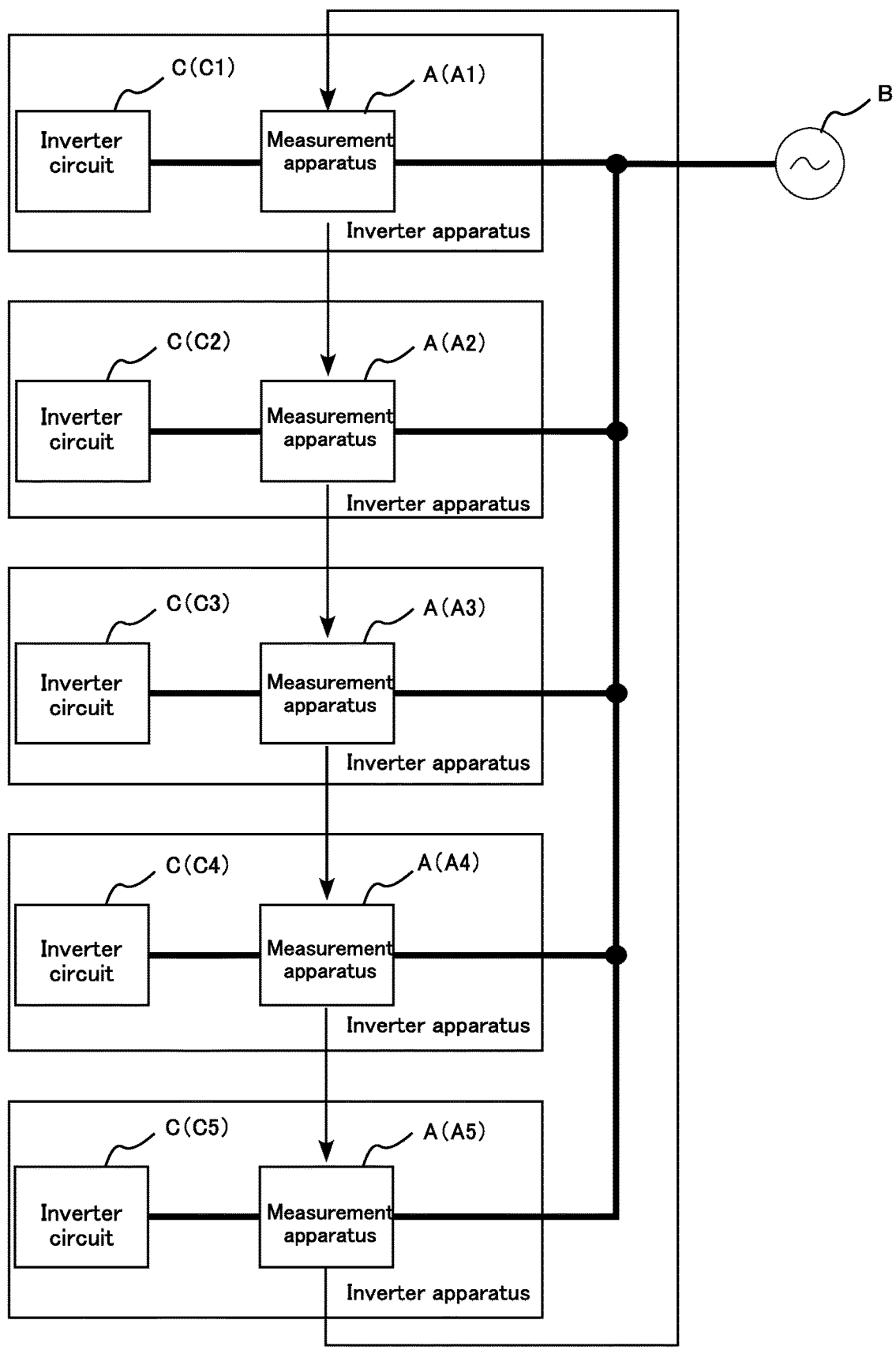
FIG. 6 is a diagram illustrating an example of the communication state of the measurement apparatuses.

Note that the first embodiment has described the case where each measurement apparatus A mutually communicates with at least one other measurement apparatus A, but the present invention is not limited to this and may be such that one-way communication is performed between two measurement apparatuses A. For example, in the example shown in FIG. 6, the measurement apparatus A1 receives a signal from the measurement apparatus A5 but does not transmit a signal to the measurement apparatus A5. Furthermore, the measurement apparatus A1 transmits a signal to the measurement apparatus A2 but does not receive a signal from the measurement apparatus A2. The same situation applies to other measurement apparatuses A2 to A5. Even if one-way communication is performed between two measurement apparatuses A as described above, the internal average values $X_i$ can converge to an arithmetic average value. More generally speaking, a condition that the internal average values $X_i$ converge to an arithmetic average value is a state in which an arbitrary measurement apparatus A can be reached by following the transmission destinations from a measurement apparatus A (the state including the "spanning tree" in the graph algorithm). Furthermore, the condition that the internal average values $X_i$ converge to an arithmetic average value is a state in which an arbitrary measurement apparatus A can be reached by following the transmission destinations from a measurement apparatus A (the "strong connectivity" state in the graph algorithm), and in which in all the measurement apparatuses A, the number of destination measurement apparatuses A (the number of measurement apparatuses to which a signal is transmitted) and the number of measurement apparatuses A that performs transmission (the number of measurement apparatuses from which a signal is received) are equal to each other (the "balanced graph" state in the graph algorithm).

The foregoing first embodiment has described the case where the measurement apparatuses A calculate an arithmetic average value, but the present invention is not limited to this. The convergence value $X\alpha$ is changed depending on the computing equation that is set for the computing unit 51. It is also possible that, by changing the computing equation, the measurement apparatuses A calculate a weighted average value, a geometric average value, a harmonic average value, a P-th order average value, and the like. Note that in order to calculate the sum total, it is necessary to calculate an arithmetic average value.

In the foregoing first embodiment, it is desired that generation timings of the internal average values $X_i$ of the average value generation units 5 of the measurement apparatuses A are matched with each other.

FIGS. 7 and 8 are diagrams illustrating the relationship between the generation timing of the internal average values $X_i$ and the convergence value of the internal average values $X_i$.

Figure 7A:
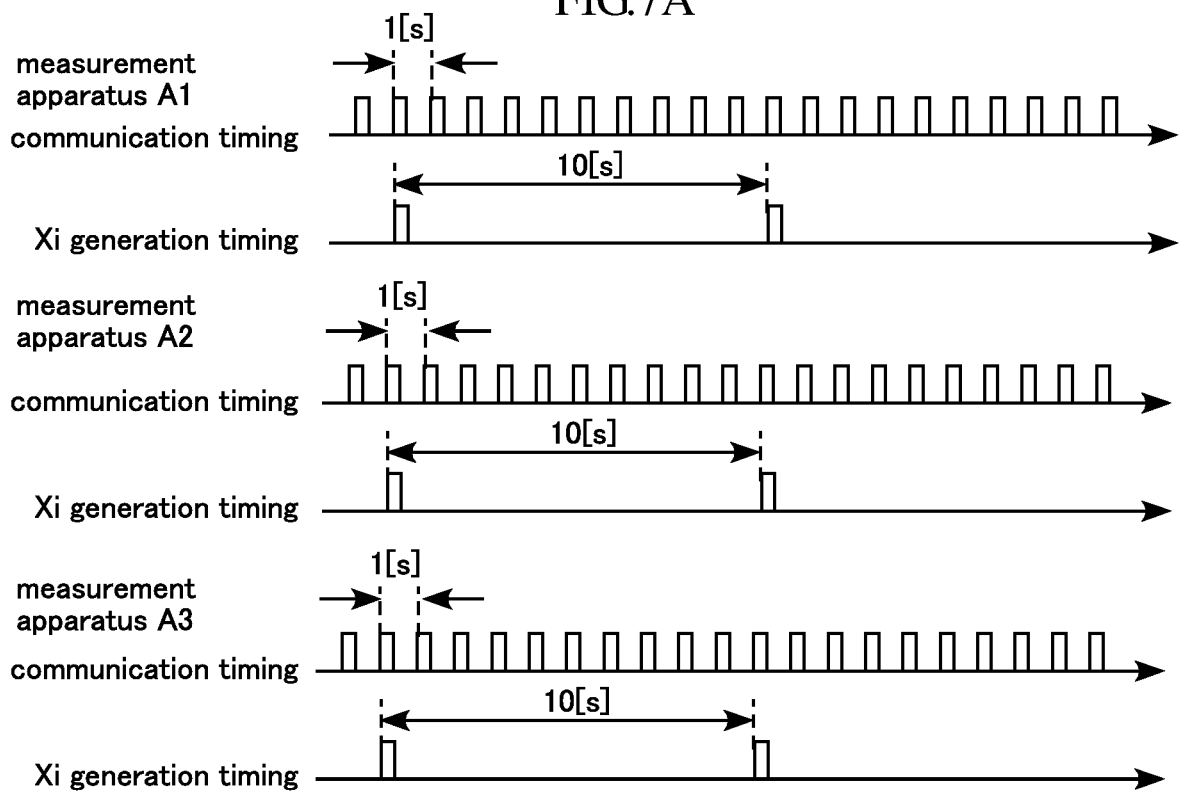
FIGS. 7A and 7B are diagrams illustrating the relationship between the generation timing of an internal average value and the convergence value of the internal average value.
Figure 7B:
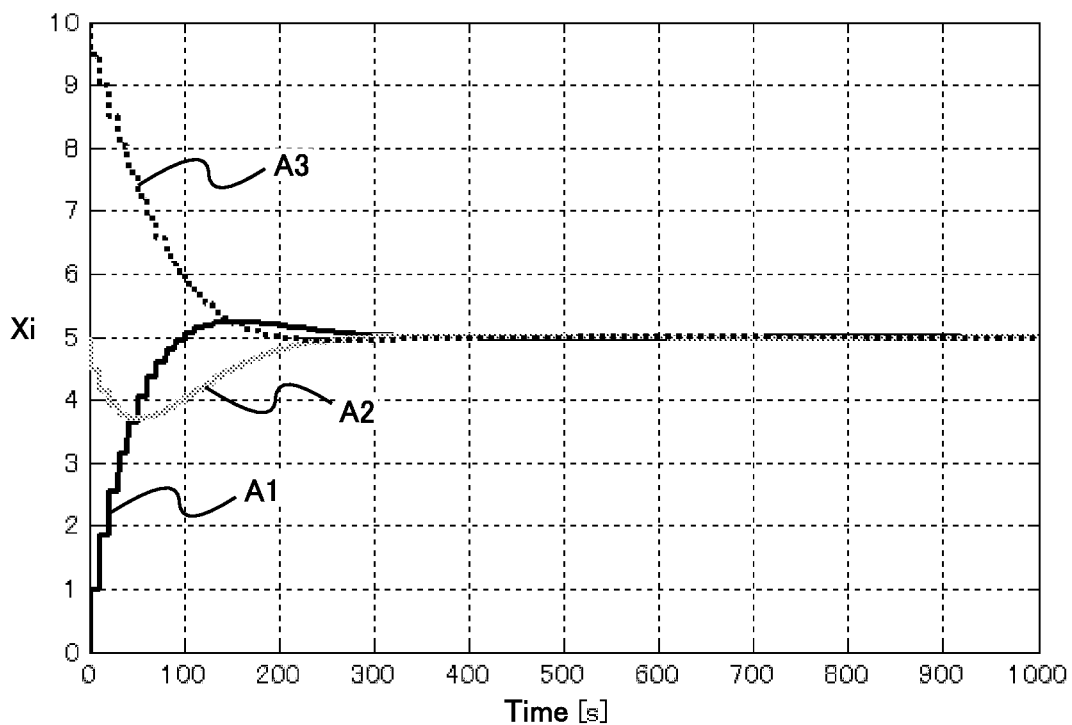

FIGS. 7A and 7B are diagrams illustrating the case where the generation timings of the internal average values $X_i$ of three measurement apparatuses A1 to A3 are matched with each other. FIG. 7A shows the communication timings of the measurement apparatuses A1 to A3 and the timings at which the internal average values $X_i$ thereof are generated. The communication timings of the measurement apparatuses A1 to A3 are matched with each other, and are at an interval of 1 second. Furthermore, the generation timings of the internal average values $X_i$ of the measurement apparatuses A1 to A3 are also matched with each other, and are at an interval of 10 seconds. FIG. 7B shows the simulation result, showing the time variations of the internal average values $X_i$ of the measurement apparatuses A1 to A3. The initial values of the internal average values $X_i$ of the measurement apparatuses A1 to A3 are respectively "0", "5", and "10", and the coefficient s of the multiplier 52 is "0.1". As show in FIG. 7B, the internal average values $X_i$ of the measurement apparatuses A1 to A3 converge to "5" that is the theoretical arithmetic average value.

Figure 8A:
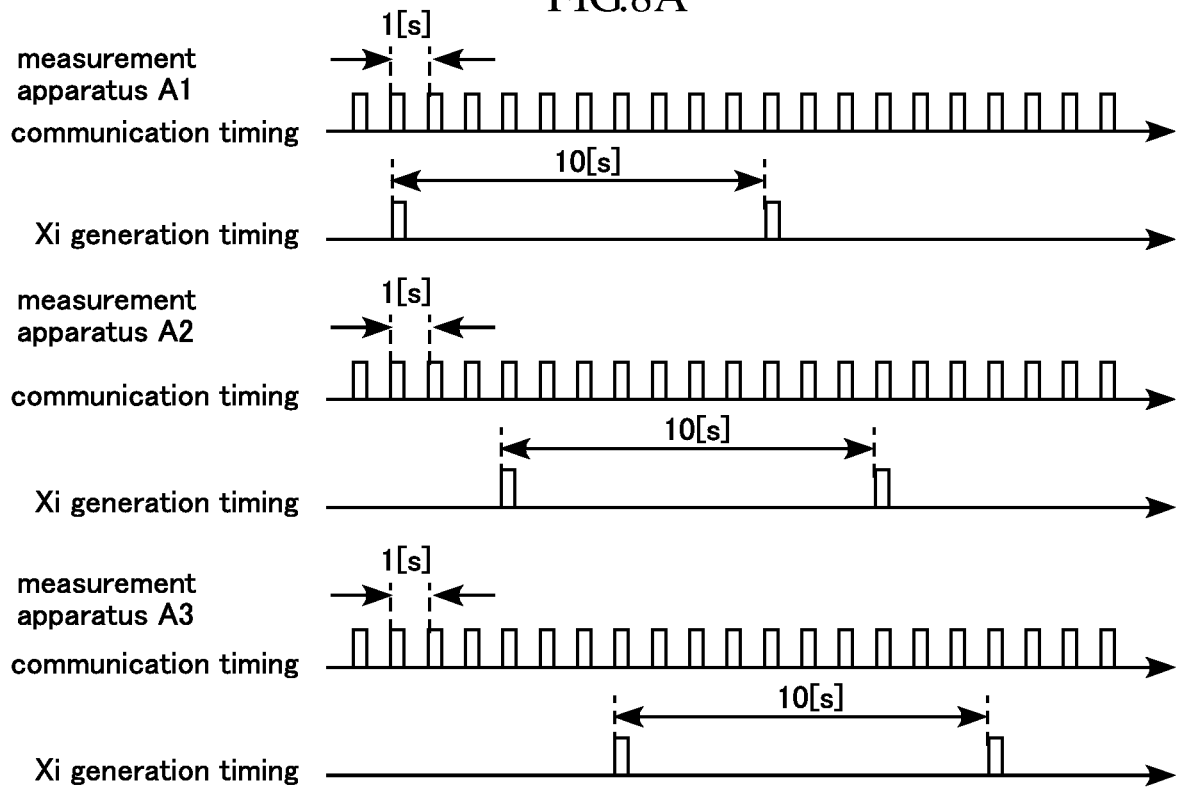
FIGS. 8A and 8B are diagrams illustrating the relationship between the generation timing of an internal average value and the convergence value of the internal average value.
Figure 8B:
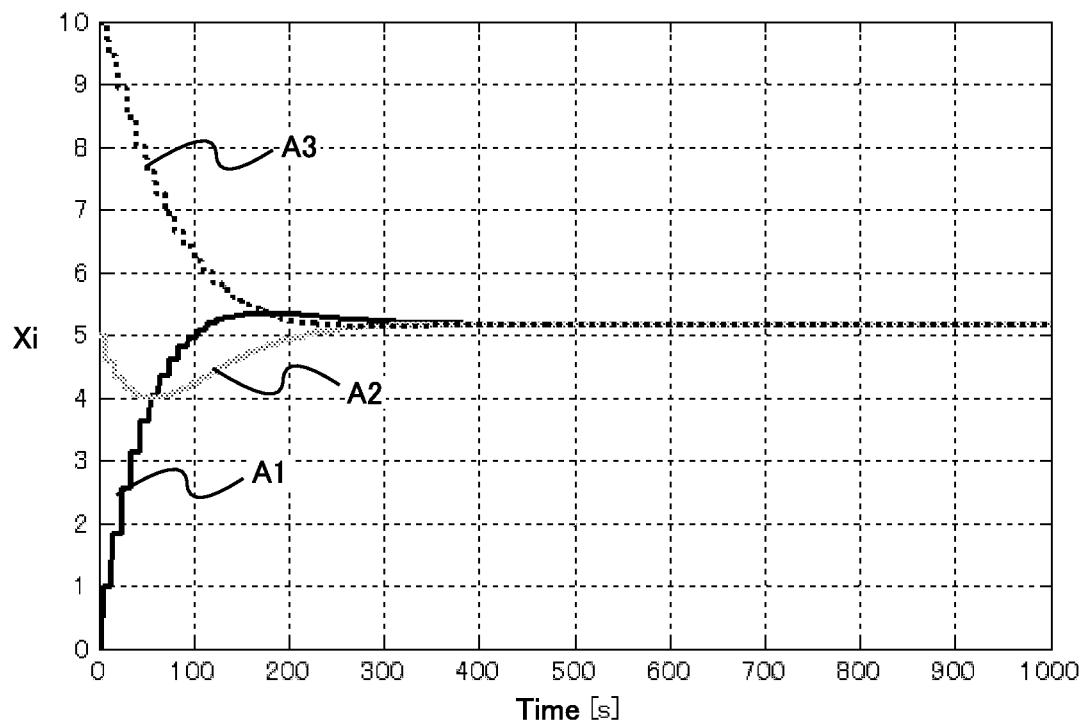

FIGS. 8A and 8B are diagrams illustrating the case where generation timings of the internal average values $X_i$ of three measurement apparatuses A1 to A3 are shifted with respect to each other. FIG. 8A shows, similarly to FIG. 7A, the communication timings of the measurement apparatuses A1 to A3, and the timings at which the internal average values $X_i$ thereof are generated. The communication timings of the measurement apparatuses A1 to A3 are matched with each other, and are at an interval of 1 second. However, although the timings at which the internal average values $X_i$ of the measurement apparatuses A1 to A3 are generated are at an interval of 10 second, the timings are shifted with respect to each other. FIG. 8B shows the simulation result, showing the time variations of the internal average values $X_i$ of the measurement apparatuses A1 to A3. The initial values and the coefficient ε of the internal average values $X_i$ of the measurement apparatuses A1 to A3 are the same as those in FIG. 7. As shown in FIG. 8B, the internal average values $X_i$ of the measurement apparatuses A1 to A3 converge, that is, converge to "5.1" that is shifted from the theoretical arithmetic average value.

As described above, when the generation timings of the internal average values $X_i$ in the average value generation units 5 of the measurement apparatuses A are not matched with each other, there is the case where the internal average values $X_i$ converge but not to the theoretical arithmetic average value. Accordingly, in order to converge the internal average values $X_i$ to the theoretical arithmetic average value with accuracy, the generation timings of the internal average values $X_i$ in the average value generation units 5 of the measurement apparatuses A need to be matched with each other. Examples of the method for matching the generation timings of the internal average values $X_i$ include a method using time information of GPS (Global Positioning System). That is, the average value generation units 5 of the measurement apparatuses A may need only to generate internal average values $X_i$ at the same timing, using time information of GPS. Furthermore, there is a method in which the measurement apparatuses A generate timing phases for generation timings and the timing phases are matched with the same phase.

Figure 9:
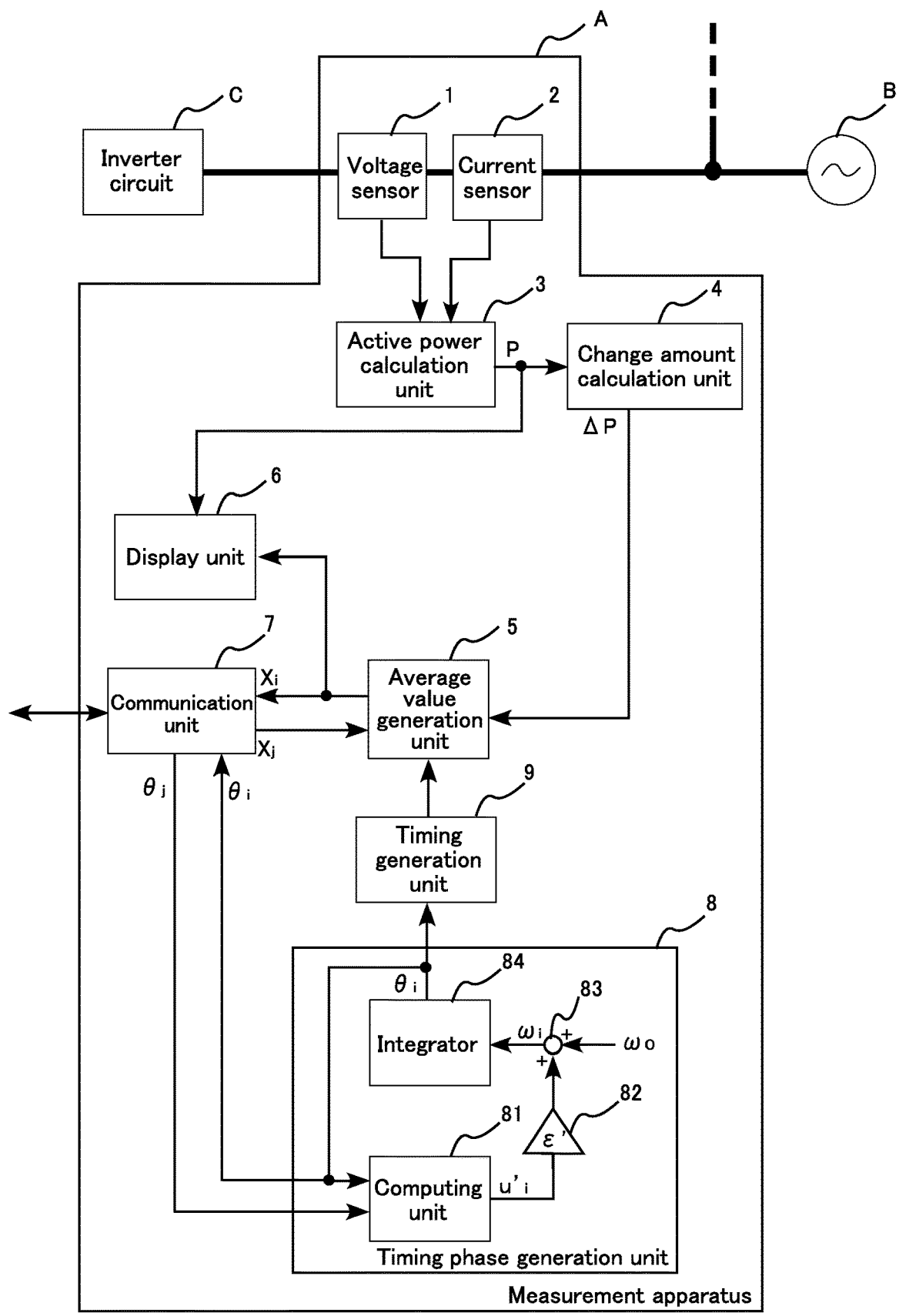
FIG. 9 is a diagram illustrating a measurement apparatus according to a second embodiment of the first aspect of the present invention.

FIG. 9 is a diagram illustrating a measurement apparatus A according to a second embodiment of the first aspect of the present invention. In the drawing, the same reference numerals are given to the same or equivalent components as or to those of the measurement apparatus A (see FIG. 1) according to the first embodiment. The measurement apparatus A according to the second embodiment differs from the measurement apparatus A according to the first embodiment in that a timing phase generation unit 8 and a timing generation unit 9 are further included, and each communication unit 7 performs transmission and reception of a timing phase $\theta_i$, in addition to the internal average value $X_i$.

The timing phase generation unit 8 generates a timing phase $\theta_i$ for instructing a generation timing of the internal average value $X_i$ in the average value generation unit 5. The timing phase generation unit 8 outputs the generated timing phase $\theta_i$ to the communication unit 7 and the timing generation unit 9. The timing phase generation unit 8 generates a new timing phase $\theta_i$, using the generated timing phase $\theta_i$ and a timing phase $\theta_j$ of another measurement apparatus A that is input from the communication unit 7. Even if the timing phase $\theta_i$ and the timing phase $\theta_j$ are different from each other, the timing phase $\theta_i$ and the timing phase $\theta_j$ converge to a common timing phase by computation processing being repeatedly performed by the timing phase generation unit 8. As shown in FIG. 9, the timing phase generation unit 8 is provided with a computing unit 81, a multiplier 82, an adder 83 and an integrator 84.

The computing unit 81 performs computation based on the following formula (5). That is, the computing unit 81 subtracts the timing phase $\theta_i$ generated by the timing phase generation unit 8 from each of the timing phases $\theta_j$ input from the communication unit 7, and outputs, to the multiplier 82, a computation result $u'_i$ obtained by summing up all the subtraction results.

$$u'_i = \sum_j (\theta_j - \theta_i) \quad (5)$$

The multiplier 82 multiplies the computation result $u'_i$ that is input from the computing unit 81 by a predetermined coefficient ε', and outputs the product to the adder 83. The coefficient ε' is a value that satisfies $0<ε'<1/d_{max}$ and is preset. Note that the coefficient ε' is used for multiplication of the computation result $u'_i$ that is to suppress an excessive variation in the timing phases $\theta_i$ due to a corrected angular frequency $\omega_i$ becoming excessively large (small). Therefore, if the processing in the timing phase generation unit 8 is continuous time processing, there will be no need to provide the multiplier 82.

The adder 83 adds the input from the multiplier 82 to a predetermined angular frequency $\omega_0$, and outputs the sum as a corrected angular frequency $\omega_1$ to the integrator 84. The angular frequency $\omega_0$ corresponds to a timing frequency. The integrator 84 integrates the corrected angular frequency $\omega_i$ that is input from the adder 83, and thereby generates and outputs a timing phase $\theta_i$. The integrator 84 adds the corrected angular frequency $\omega_i$ to a previously generated timing phase $\theta_i$, and thereby generates a timing phase $\theta_i$. Furthermore, the integrator 84 outputs a value in the range of $(-\pi<\theta_i\leq\pi)$ as the timing phase $\theta_i$. Note that the method for setting the range of the timing phase $\theta_i$ is not limited to this, and the range may also be, for example, $(0\leq\theta_i<2\pi)$. The timing phase $\theta_i$ is output to the timing generation unit 9, the communication unit 7, and the computing unit 81.

In the second embodiment, the timing phase generation unit 8 generates a timing phase $\theta_i$, using the generated timing phase $\theta_i$ and a timing phase $\theta_j$ of another measurement apparatus A that is input from the communication unit 7. If the timing phase $\theta_i$ is larger than the arithmetic average value of timing phases $\theta_j$, the computation result $u'_i$ that is output by the computing unit 81 will be a negative value. Accordingly, the corrected angular frequency $\omega_i$ is smaller than the predetermined angular frequency $\omega_0$, and the change amount in the timing phase $\theta_i$ decreases. On the other hand, if the timing phase $\theta_i$ is smaller than the arithmetic average value of timing phases $\theta_j$, the computation result $u'_i$ that is output by the computing unit 81 will be a positive value. Accordingly, the corrected angular frequency $\omega_i$ is larger than the predetermined angular frequency $\omega_0$, and the change amount in the timing phase $\theta_i$ increases. That is, the timing phase $\theta_i$ is approximated to the arithmetic average value of timing phases $\theta_j$. This processing is performed in each measurement apparatus A, and thereby the timing phases $\theta_i$ of the measurement apparatuses A converge to the same value. More specifically, the timing phase $\theta_i$ varies with time but it is conceivable that the timing phase $\theta_i$ is a phase obtained by combining a component that varies with the angular frequency $\omega_0$ and a component that varies so as to compensate shifting of initial phases. The latters converge to the same value $\theta\alpha$, and thereby the timing phases $\theta_i$ of the measurement apparatuses A also converge to the same value. The fact that the latters converge to the same value $\theta\alpha$ is also mathematically proofed (see Non-Patent Documents 1 and 2). Furthermore, the fact that, as indicated by the following formula (6), the convergence value $\theta\alpha$ is the arithmetic average value of the initial values of the timing phases $\theta_i$ of the measurement apparatuses A is also proofed. n refers to the number of the inverter apparatus installed in an power plant (that is, the number of the measurement apparatuses A), and the following formula (6) indicates that an arithmetic average value is calculated by summing up the initial values of the timing phases $\theta_1$ to $\theta_n$ of the measurement apparatuses A1 to An and dividing the sum by n.

$$\theta_\alpha = \frac{1}{n}\sum_{i=1}^{n} \theta_i(0) \qquad (6)$$

The foregoing second embodiment has described the case where a cycle T of the processing by the timing phase generation unit 8 is 1 second. If the cycle T is, for example, 0.1 second, a value to which the input from the multiplier 82 is added by the adder 83 is a value obtained by multiplying the angular frequency $\omega_0$ by 1/10. That is, $T\omega_0$, instead of $\omega_0$, is input.

The timing generation unit 9 outputs a timing signal for instructing a generation timing of the internal average value $X_i$ to the value generation unit 5. The timing generation unit 9 outputs a timing signal based on the timing phase $\theta_i$ input from the timing phase generation unit 8. Specifically, a timing signal is output at a timing at which the timing phase $\theta_i$ is "0", for example. Note that the timing at which a timing signal is output is not limited to "0". Furthermore, it is also possible that a timing signal is output at a timing at which the number of times when the timing phase $\theta_i$ is "0" is a scheduled number of times.

According to the second embodiment, since each measurement apparatus A mutually communicates with at least one measurement apparatus A and the communication state of the measurement apparatuses A is the coupled state, the timing phases $\theta_i$ of all the measurement apparatuses A converge to the same value. Accordingly, it is possible to set the same generation timing of the internal average value $X_i$ in the average value generation units 5 for the measurement apparatuses A. Therefore, the measurement apparatuses A can converge the internal average values $X_i$ to the theoretical arithmetic average value with accuracy.

Note that the second embodiment has described the case where the component that varies so as to compensate shifting of initial phases of the timing phases $\theta_i$ of the measurement apparatuses A converge to the arithmetic average value of the initial values of the timing phases $\theta_i$ of the measurement apparatuses A, but the present invention is not limited to this. The convergence value $\theta\alpha$ can be changed depending on the computing equation set for the computing unit 81.

For example, in the case where the computing equation set for the computing unit 81 is the following formula (7), the convergence value $\theta\alpha$ is a value as shown in the following formula (8). $d_i$ refers to the number of other measurement apparatuses A with which the communication unit 7 communicates, that is, the number of timing phases $\theta_j$ that are input into the communication unit 7. That is, the convergence value $\theta\alpha$ is a weighted average value of the initial values of the timing phases $\theta_i$ of the measurement apparatuses A, the weighted average value being weighted by the number of communication partners.

$$u_i' = \frac{1}{d_i}\sum_j (\theta_j - \theta_i) \qquad (7)$$

$$\theta_\alpha = \frac{\sum_{i=1}^{n} d_i \theta_i(0)}{\sum_{i=1}^{n} d_i} \qquad (8)$$

Furthermore, in the case where the computing equation that is set for the computing unit 81 is the following formula (9), the convergence value $\theta\alpha$ is a geometric average value of the initial values of the timing phases $\theta_i$ of the measurement apparatuses A as shown in the following formula (10).

$$u_i' = \theta_i \sum_j (\theta_j - \theta_i) \qquad (9)$$

$$\theta_\alpha = \sqrt[n]{\prod_{i=1}^{n} \theta_i(0)} \qquad (10)$$

Furthermore, in the case where the computing equation that is set for the computing unit 81 is the following formula (11), the convergence value $\theta\alpha$ is a harmonic average value of the initial values of the timing phases $\theta_i$ of the measurement apparatuses A as shown in the following formula (12).

$$u_i' = \theta_i^2 \sum_j (\theta_i - \theta_j) \qquad (11)$$

$$\theta_\alpha = \frac{n}{\sum_{i=1}^{n} \frac{1}{\theta_i(0)}} \qquad (12)$$

Furthermore, in the case where the computing equation that is set for the computing unit 81 is the following formula (13), the convergence value $\theta\alpha$ is a P-th order average value of the initial values of the timing phases $\theta_i$ of the measurement apparatuses A as shown in the following formula (14).

$$u_i' = \frac{1}{P\theta_i^{P-1}}\sum_j (\theta_j - \theta_i) \qquad (13)$$

$$\theta_\alpha = \sqrt[P]{\sum_{i=1}^{n} \frac{1}{n}\theta_i(0)^P} \qquad (14)$$

The first and second embodiments have described the case where the measurement apparatus A calculates an arithmetic average value of output active powers, but the present invention is not limited to this. For example, if each active power calculation unit 3 is configured to calculate a reactive power, the measurement apparatus A can function as a reactive power measurement apparatus that can calculate an arithmetic average value of output reactive powers. Furthermore, it is also possible that output voltages and output currents of the inverter circuit C are measured and the arithmetic average values thereof are calculated. Furthermore, it is also possible that input powers, input voltages, and input currents from a solar cell connected to the inverter circuit C are measured and the arithmetic average values thereof are calculated. Furthermore, it is also possible that voltage phases and frequencies from a voltage signal are detected and the arithmetic average value thereof is calculated. Furthermore, it is also possible that solar radiation intensities to the solar cell, amounts of solar radiation, the temperatures of the solar cell, and the like are measured and the arithmetic average values thereof are calculated. Furthermore, it is also possible that the arithmetic average value is calculated based on some or all of the measured values.

The foregoing first and second embodiments have described the case where the measurement apparatuses A are included in inverter apparatuses that are installed in a solar power plant and connected to solar cells, but the present invention is not limited to this. For example, the present invention is applicable to measurement apparatuses that are included in inverter apparatuses installed in a wind power plant. In this case, the wind speeds and the wind amounts may be measured, and the arithmetic average values thereof may be calculated. Furthermore, the present invention is also applicable to a measurement apparatus that is arranged on an electric distribution line or feeder line of an electric power system or an outlet at home or building and measures electric information (voltage, current, electric power, and the like). Furthermore, the present invention is also applicable to a measurement apparatus that measures electric information of an output of a fuel battery, a rechargeable battery, a diesel engine generator, a micro gas turbine generator, and the like.

Furthermore, the present invention is also applicable to a measurement apparatus that measures information (such as an atmosphere pressure, a flow rate, and a weight, in addition to the above-described temperature, solar radiation intensity, amount of solar radiation, wind speed, and wind amount) other than electric information. The case where the measurement apparatus A functions as a temperature measurement apparatus will be described as a third embodiment below.

Figure 10:
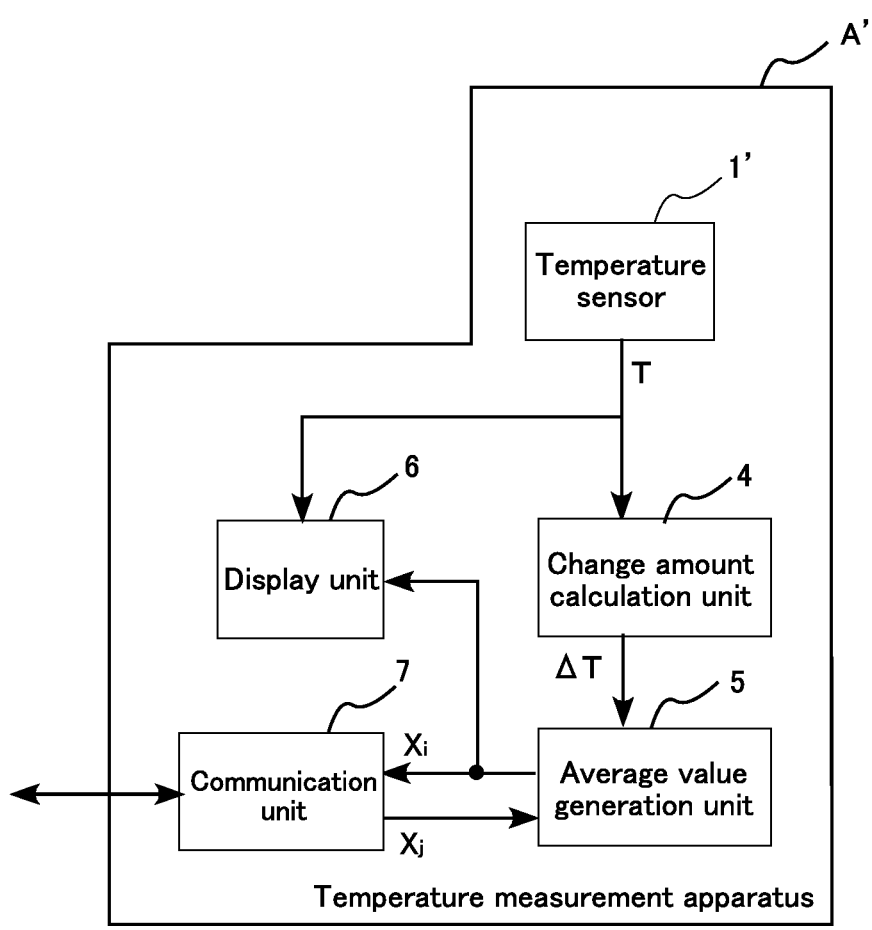
FIG. 10 is a diagram illustrating a temperature measurement apparatus according to a third embodiment of the first aspect of the present invention.

FIG. 10 is a diagram illustrating a measurement apparatus (temperature measurement apparatus) A' according to the third embodiment of the first aspect of the present invention. In the drawing, the same reference numerals are given to the same or similar components as or to those of the measurement apparatus A (see FIG. 1) according to the first embodiment. The temperature measurement apparatus A' according to the third embodiment differs from the measurement apparatus A according to the first embodiment in being provided with a temperature sensor 1', instead of the voltage sensor 1, the current sensor 2, and the active power calculation unit 3.

The temperature sensor 1' detects a temperature T at the position at which temperature sensor 1' is arranged, and uses, for example, a thermistor or a thermocouple. The detected temperature T is output to the change amount calculation unit 4 and the display unit 6. The change amount calculation unit 4 calculates a change amount ΔT of the temperature T that is input from the temperature sensor 1', and outputs the calculated change amount ΔT to the average value generation unit 5. The average value generation unit 5 generates an internal average value $X_i$, and performs transmission and reception to and from another temperature measurement apparatus A' via the communication unit 7.

Also in the third embodiment, if each temperature measurement apparatus A' mutually communicates with at least one temperature measurement apparatus A' and the communication state of the temperature measurement apparatuses A' is the coupled state, the internal average values $X_i$ of all the temperature measurement apparatus A' can converge to a theoretical arithmetic average value. Accordingly, the arithmetic average value of the temperatures measured by the temperature measurement apparatuses A' can be displayed on the display unit 6.

According to the present invention, it is possible to detect a malfunction that may occur in the system, using the measurement apparatus A (A') according to any one of the first to third embodiments. For example, assume that in a solar power plant, all of arranged inverter apparatuses are of the same standard, and all of solar cell arrays that are connected to the inverter apparatuses are of the same standard. In this case, if the system does not have a malfunction, output active powers of the inverter apparatuses should substantially be the same value. Therefore, if the active power P measured by the measurement apparatus A largely differs from the internal average value $X_i$ generated by the average value generation unit 5, it is possible to determine that the inverter apparatus or the solar cell array connected to the inverter apparatus has a malfunction.

Figure 11:
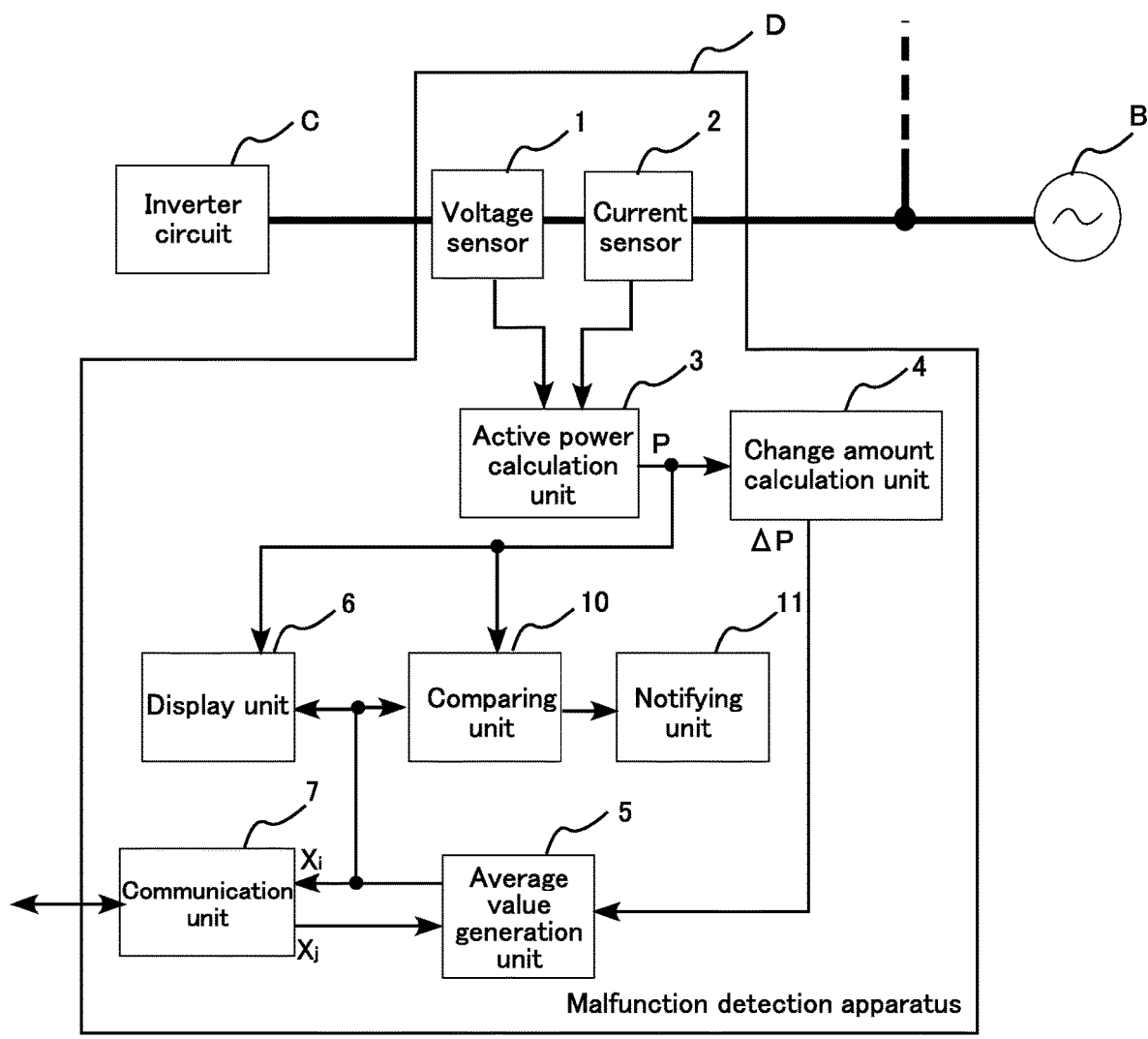
FIG. 11 is a diagram illustrating a malfunction detection apparatus according to a fourth embodiment of the first aspect of the present invention.

FIG. 11 is a diagram illustrating a measurement apparatus (malfunction detection apparatus) D according to a fourth embodiment of the first aspect of the present invention. In the drawing, the same reference numerals are given to the same or similar components as those of the measurement apparatus A (see FIG. 1) according to the first embodiment. The malfunction detection apparatus D according to the fourth embodiment differs from the measurement apparatus A according to the first embodiment in being further provided with a comparing unit 10 and a notifying unit 11.

The comparing unit 10 compares an active power P that is input from the active power calculation unit 3 with an internal average value $X_i$ that is input from the average value generation unit 5, and if a difference between the active power P and the internal average value $X_i$ is a predetermined threshold or more ($|P-X_i|\geq$threshold), the comparing unit 10 determines that there is a malfunction and outputs an malfunction detection signal to the notifying unit 11. Note that it is also possible to determine that there is a malfunction if the state in which the difference between the active power P and the internal average value $X_i$ is the predetermined threshold or more is continued for a predetermined time. Alternatively, it is also possible to determine that there is a malfunction only if the active power P is larger than the internal average value $X_i$ by a threshold ($P-X_i\geq$threshold), or if the internal average value $X_i$ is larger than the active power P by the threshold ($X_i-P\geq$threshold).

When the malfunction detection signal is input from the comparing unit 10, the notifying unit 11 emits a buzzer tone or turns on a lamp, for example. Alternatively, a warning indicating an occurrence of a malfunction (character, figure, or the like) may be displayed on the display unit 6. Alternatively, the malfunction detection signal may be output to the monitoring apparatus 103 (see FIG. 23) and the monitoring apparatus 10 may display the occurrence of a malfunction and the inverter apparatus in which the malfunction is occurring.

At the time at which a malfunction occurs, not only notification of the malfunction but also stopping the operation of the inverter circuits C (or the inverter circuit C that is relevant to the malfunction) may also be performed. Furthermore, for example, two thresholds may also be set. In this case, for example, if a difference between the active power P and the internal average value $X_i$ exceeds the smaller threshold, notification of the malfunction will be performed (failure prognostic), and if the difference exceeds the larger threshold, the operation of the circuit C will be stopped (determination as failure). Alternatively, it is also possible that thresholds are set further in levels, and the degree of a malfunction in levels may be notified.

Furthermore, the malfunction detection apparatus D can detect a malfunction in solar cells (solar cell array) by being configured to measure input voltages or input powers that are input into the inverter circuit C from the solar cells (solar cell array).

Figure 12:
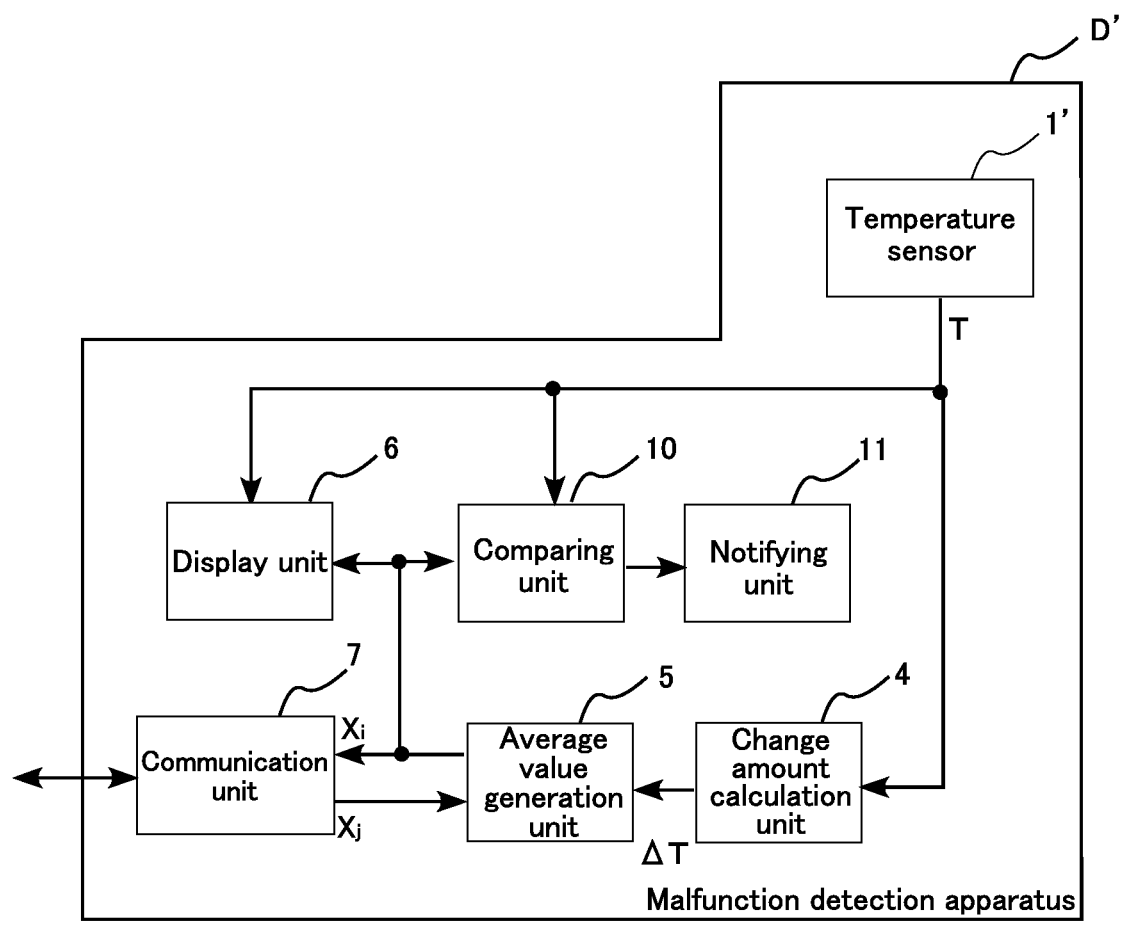
FIG. 12 is a diagram illustrating a malfunction detection apparatus according to a fifth embodiment of the first aspect of the present invention.

FIG. 12 is a diagram illustrating a malfunction detection apparatus D' according to a fifth embodiment of the first aspect of the present invention. This malfunction detection apparatus D' is configured to detect a malfunction in each solar cell module of the solar cell array. In the drawing, the same reference numerals are given to the same or similar components as or to those of the temperature measurement apparatus A' (see FIG. 10) according to the third embodiment. The malfunction detection apparatus D' according to the fifth embodiment differs from the temperature measurement apparatus A' according to the third embodiment in being further provided with the comparing unit 10 and the notifying unit 11. The comparing unit 10 and the notifying unit 11 are the same as the comparing unit 10 and the notifying unit 11 according to the fourth embodiment, for example.

The malfunction detection apparatus D' is mounted on each solar cell module of the solar cell array. By the temperature sensor 1' measuring a panel temperature, it is possible to detect which solar cell module of the solar cell array has a malfunction. That is, by the malfunction detection apparatus D' mounted on each solar cell module communicating with another malfunction detection apparatus, the internal average values $X_i$ generated by the average value generation units 5 converge to the arithmetic average value of the panel temperatures of the solar cell modules. If a solar cell module has a malfunction, the panel temperature increases (or decreases), and thus a difference occurs between the temperature T detected by the malfunction detection apparatus D' mounted thereon and the internal average value $X_i$, and the malfunction is detected. Note that the malfunction detection apparatus D' may also be mounted on not each solar cell module but each solar cell (or each set of some cells). Furthermore, the present invention is not limited to detection of a malfunction based on temperatures, and a malfunction may be detected by detecting an output power, output voltage, or output current of the solar cell modules.

The measurement apparatus, the malfunction detection apparatus, the calculation method, and the malfunction detection method according to the first aspect of the present invention are not limited to those of the above-described embodiments, and variety of design modifications are applicable to specific configurations of the components.

Hereinafter, embodiments of a second aspect of the present invention will be described. In the following embodiments, a measurement apparatus is used as a measurement apparatus that measures an output active power, but the present invention is not limited to this.

Figure 13:
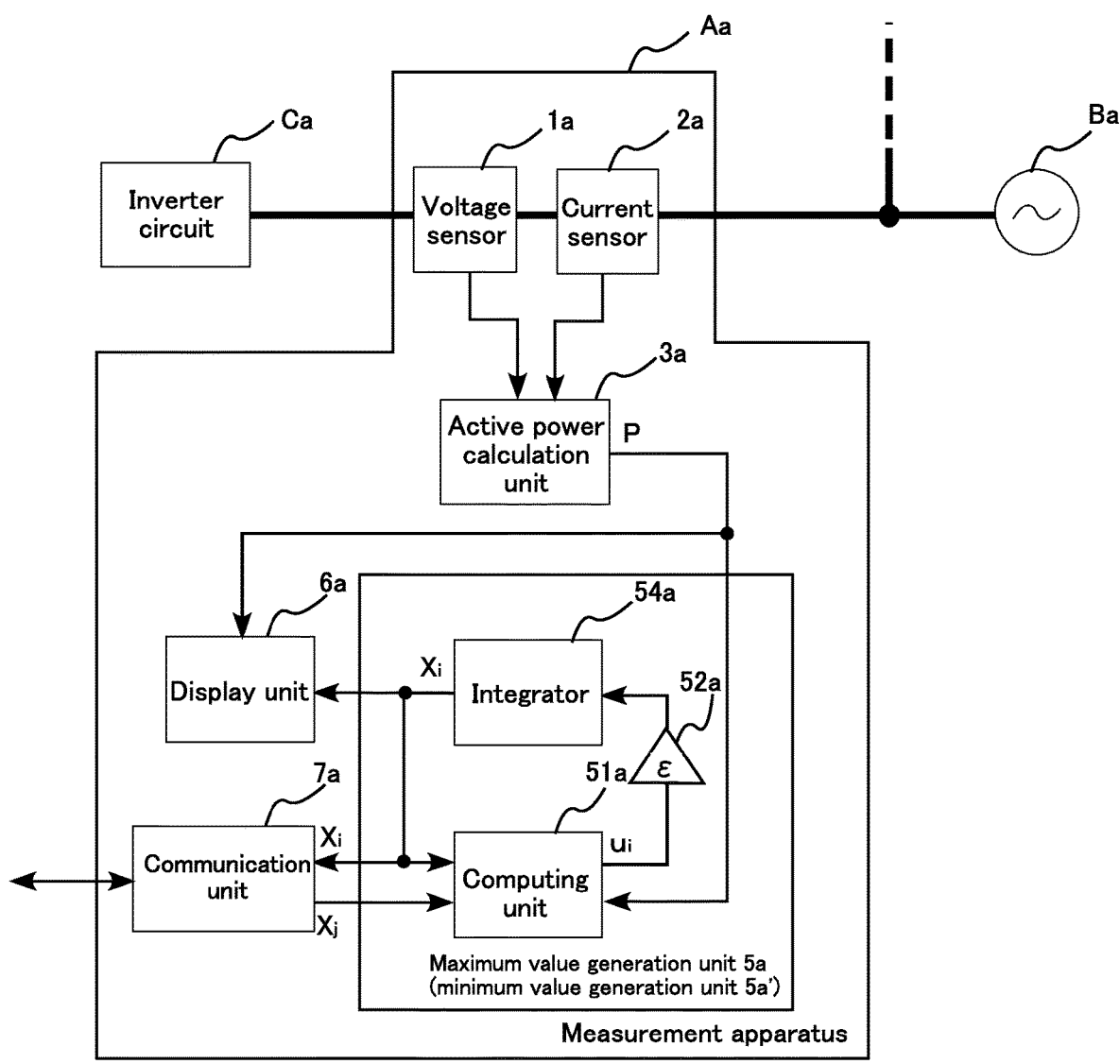
FIG. 13 is a diagram illustrating a measurement apparatus according to a first embodiment of a second aspect of the present invention.
Figure 14:
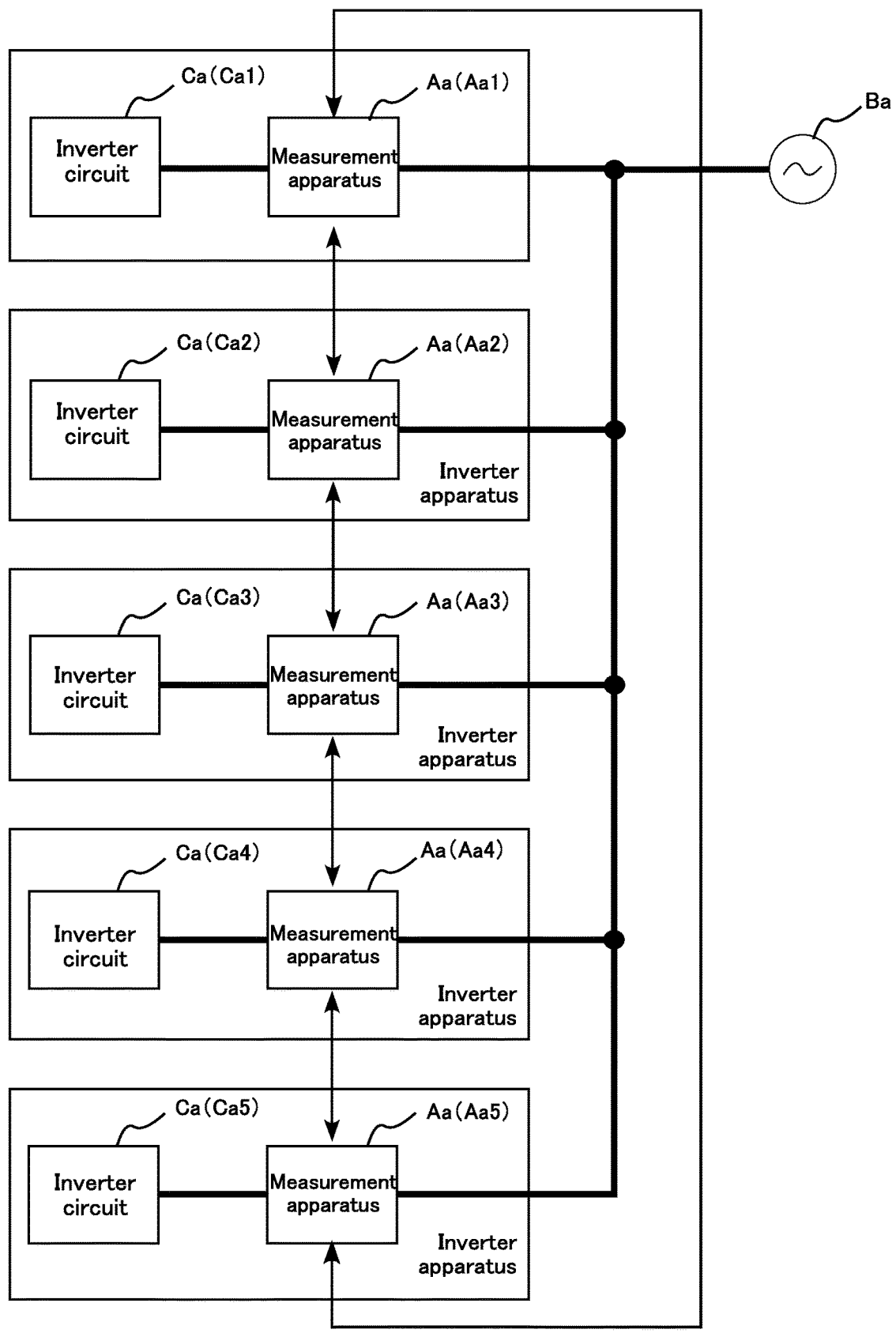
FIG. 14 is a diagram showing a solar power plant in which a plurality of inverter apparatuses are connected in parallel.

FIG. 13 is a diagram illustrating a measurement apparatus Aa according to a first embodiment of the second aspect. Inside an inverter apparatus connected to an electric power system Ba, the measurement apparatus Aa is arranged on the output side of an inverter circuit Ca. FIG. 14 is a diagram showing a solar power plant in which a plurality of inverter apparatuses are connected in parallel, and shows the state in which the measurement apparatuses Aa that are provided in the inverter apparatuses perform communication.

Each inverter circuit Ca converts a direct-current power input from a solar cell (illustration thereof is omitted) into an alternating-current power, and outputs the converted alternating-current power to the electric power system Ba. The measurement apparatus Aa measures an output active power of the inverter circuit Ca. The shown inverter apparatus may be, for example, a power conditioner, and may include, in addition to the inverter circuit Ca and the measurement apparatus Aa, a control circuit that controls the inverter circuit Ca, and various type of protection equipment.

As shown in FIG. 13, the measurement apparatus Aa is provided with a voltage sensor 1a, a current sensor 2a, an active power calculation unit 3a, a maximum value generation unit 5a, a display unit 6a, and a communication unit 7a. The measurement apparatus Aa calculates an active power P that is output by the inverter circuit Ca based on a voltage signal detected by the voltage sensor 1a and a current signal detected by the current sensor 2a.

The voltage sensor 1a is arranged on an output line of the inverter circuit Ca, and detects the instantaneous value of a voltage at the position at which the voltage sensor 1a is arranged. The voltage sensor 1a converts the detected instantaneous value into a digital value, and outputs the converted digital value as a voltage signal to the active power calculation unit 3a. Similarly, the current sensor 2a is arranged on the output line of the inverter circuit Ca, and detects the instantaneous value of a current at the position at which the current sensor 2a is arranged. The current sensor 2a converts the detected instantaneous value into a digital value, and outputs the converted digital value as a current signal to the active power calculation unit 3a.

The active power calculation unit 3a calculates an active power P based on a voltage signal input from the voltage sensor 1a and a current signal input from the current sensor 2a. The active power calculation unit 3a updates the calculated active power P at a predetermined timing (for example, in an interval of 1 second), and outputs the updated and calculated active power P to the maximum value generation unit 5a and the display unit 6a.

Figure 15:
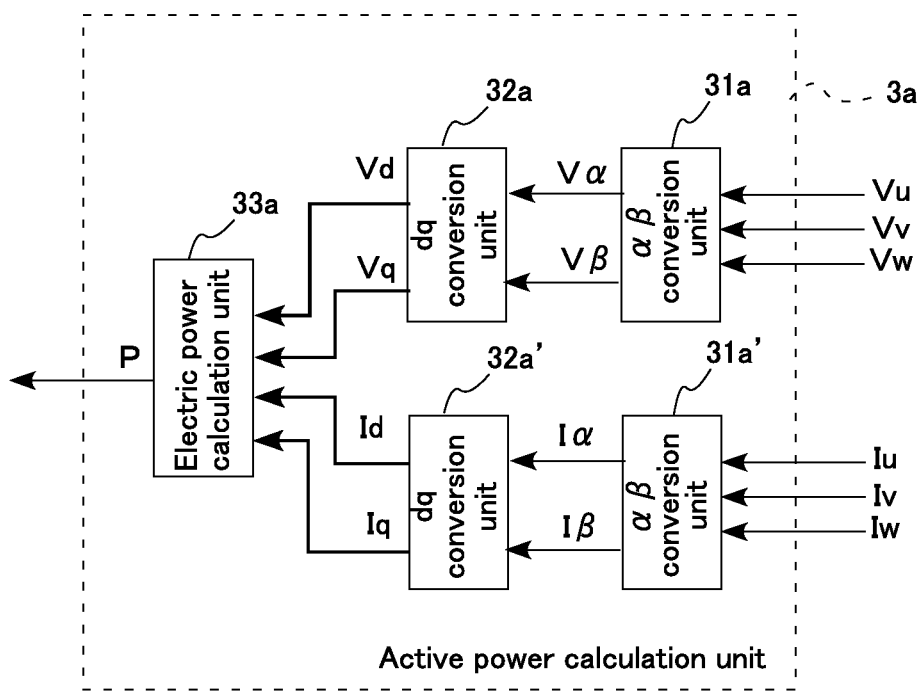
FIG. 15 is a diagram showing an example of the internal configuration of the active power calculation unit.

FIG. 15 is a diagram showing an example of an internal configuration of the active power calculation unit 3a.

The active power calculation unit 3a calculates an active power P based on three-phase voltage signals and three-phase current signals, and includes αβ conversion units 31a and 31a', dq conversion units 32a and 32a', and an electric power calculation unit 33a.

The αβ conversion unit 31a converts three-phase voltage signals Vu, Vv, and Vw that are input from the voltage sensor 1a into two-phase voltage signals Vα and Vβ. Upon input of the voltage signals Vα and Vβ from the αβ conversion unit 31a, the dq conversion unit 32a calculates an in-phase component Vd and a phase-difference component Vq. The αβ conversion unit 31a' converts three-phase current signals Iu, Iv, and Iw that are input from the current sensor 2a into two-phase current signals Iα and Iβ. Upon input of the current signals Iα and Iβ from the αβ conversion unit 31a', the dq conversion unit 32a' calculates an in-phase component Id and a phase-difference component Iq.

The electric power calculation unit 33a calculates an active power P based on the following formula (1a), using the in-phase component Vd and the phase-difference component Vq that are input from the dq conversion unit 32a and the in-phase component Id and the phase-difference component Iq that are input from the dq conversion unit 32a'. The electric power calculation unit 33a calculates, at a predetermined timing, an average value in a period from the previous timing to the current timing, and outputs the calculated average value as the active power P.

$$P = V_d \cdot I_d + V_q \cdot I_q \tag{1a}$$

Note that the active power calculation unit 3a shown in FIG. 15 is merely an example, and the present invention is not limited to this. For example, an active power P may also be calculated based on the voltage signals Vα and Vβ and the current signals Iα and Iβ, or based on the voltage signals Vu, Vv, and Vw and the current signals Iu, Iv, and Iw. Furthermore, an active power P may also be calculated based on effective values of a voltage and a current, and a phase difference between the voltage and the current.

The maximum value generation unit 5a generates an internal maximum value $X_i$ of active powers P calculated by the corresponding measurement apparatus Aa. The internal maximum value $X_i$ is the maximum value of the active powers P calculated by each measurement apparatus Aa, the internal maximum value $X_i$ being provisionally calculated inside the measurement apparatus Aa. As will be described later, the internal maximum values $X_i$ of the measurement apparatuses Aa converge to the maximum value of the active powers P calculated by the measurement apparatuses Aa by computation processing being repeatedly performed by the maximum value generation unit 5a. The maximum value generation unit 5a outputs the generated internal maximum value $X_i$ to the display unit 6a and the communication unit 7a. The detail of the maximum value generation unit 5a will be described later.

The display unit 6a displays measured values, and displays an active power P input from the active power calculation unit 3a as an output active power of the inverter circuit Ca. Furthermore, the display unit 6a displays the internal maximum value $X_i$ input from the maximum value generation unit 5a as the maximum value of the output active powers of the inverter apparatuses installed in the power plant.

The communication unit 7a communicates with another measurement apparatus Aa. Upon input of an internal maximum value $X_i$ generated by the maximum value generation unit 5a, the communication unit 7a transmits the internal maximum value $X_i$ to the communication unit 7a of the other measurement apparatus Aa. Furthermore, the communication unit 7a outputs an internal maximum value $X_j$ received from the communication unit 7a of another measurement apparatus Aa to the maximum value generation unit 5a. The communication method may be, for example, wired communication or wireless communication.

As shown in FIG. 14, each measurement apparatus Aa is arranged on the output side of the inverter circuit Ca inside the corresponding inverter apparatus connected to the electric power system Ba. FIG. 14 shows, for ease of illustration, the state in which five inverter apparatuses are connected to the electric power system Ba, but actually, a larger number of inverter apparatuses are used.

The arrows shown in FIG. 14 indicate that the measurement apparatuses Aa communicate with each other. Specifically, a measurement apparatus Aa1 mutually communicates only with a measurement apparatus Aa5 and a measurement apparatus Aa2, and the measurement apparatus Aa2 mutually communicates only with the measurement apparatus Aa1 and a measurement apparatus Aa3. Furthermore, the measurement apparatus Aa3 mutually communicates only with the measurement apparatus Aa2 and a measurement apparatus Aa4, and the measurement apparatus Aa4 mutually communicates only with the measurement apparatus Aa3 and the measurement apparatus Aa5, and the measurement apparatus Aa5 mutually communicates only with the measurement apparatus Aa4 and the measurement apparatus Aa1. Accordingly, a measurement apparatus Aa communicates with at least one of other measurement apparatuses Aa, and the state ("coupled state") is realized in which a communication path between two arbitrary measurement apparatuses Aa exists. If such a coupled state is realized, each measurement apparatus Aa does not need to communicate with all other measurement apparatuses Aa.

For example, in the case of the measurement apparatus Aa2, the communication unit 7a transmits an internal maximum value $X_2$ generated by the maximum value generation unit 5a to the communication units 7a of the measurement apparatuses Aa1 and Aa3. Furthermore, the communication unit 7a of the measurement apparatus Aa2 receives an internal maximum value $X_1$ from the communication unit 7a of the measurement apparatus Aa1, and an internal maximum value $X_3$ from the communication unit 7a of the measurement apparatus Aa3.

Hereinafter, the detail of the maximum value generation unit 5a of each measurement apparatus Aa will be described.

The maximum value generation unit 5a generates an internal maximum value $X_i$, using the generated internal maximum value $X_i$ and an internal maximum value $X_j$ of another measurement apparatus Aa that is input from the communication unit 7a. Even if the internal maximum value $X_i$ and the internal maximum value $X_j$ are different from each other, the internal maximum value $X_i$ and the internal maximum value $X_j$ converge to a common value by computation processing being repeatedly performed by the maximum value generation unit 5a. As shown in FIG. 13, the maximum value generation unit 5a is provided with a computing unit 51a, a multiplier 52a, and an integrator 54a.

The computing unit 51a performs computation based on the following formula (2a). $\alpha_{ij}$ is a function that is "1" if $X_j > X_i$ is satisfied, and is "0" if $X_j \leq X_i$ is satisfied. That is, the computing unit 51a outputs, to the multiplier 52a, a computation result $u_i$ that is obtained by subtracting the internal maximum value $X_i$ generated by the maximum value generation unit 5a from each of internal maximum values $X_j$ that are input from the communication unit 7a and summing up all the subtraction results that are a positive value. However, if the active power P that is input from the active power calculation unit 3a has varied, the computation result $u_i$ is calculated using, instead of the internal maximum value $X_i$, the active power P (that is, $X_i$ is substituted by P in the following formula (2a)).

$$u_i = \sum_j \alpha_{ij}(X_j - X_i) \tag{2a}$$

For example, in the case of the measurement apparatus Aa2 (see FIG. 14), if the active power P has not varied and $X_1 > X_2 > X_3$ is satisfied, the computing unit 51a performs computation of the following formula (3a) to output a computation result $u_2$.

$$\begin{aligned} u_2 &= \sum_{j=1,3} \alpha_{2j}(X_j - X_2) \\ &= 1 \cdot (X_1 - X_2) + 0 \cdot (X_3 - X_2) \\ &= X_1 - X_2 \end{aligned} \tag{3a}$$

Figure 16:
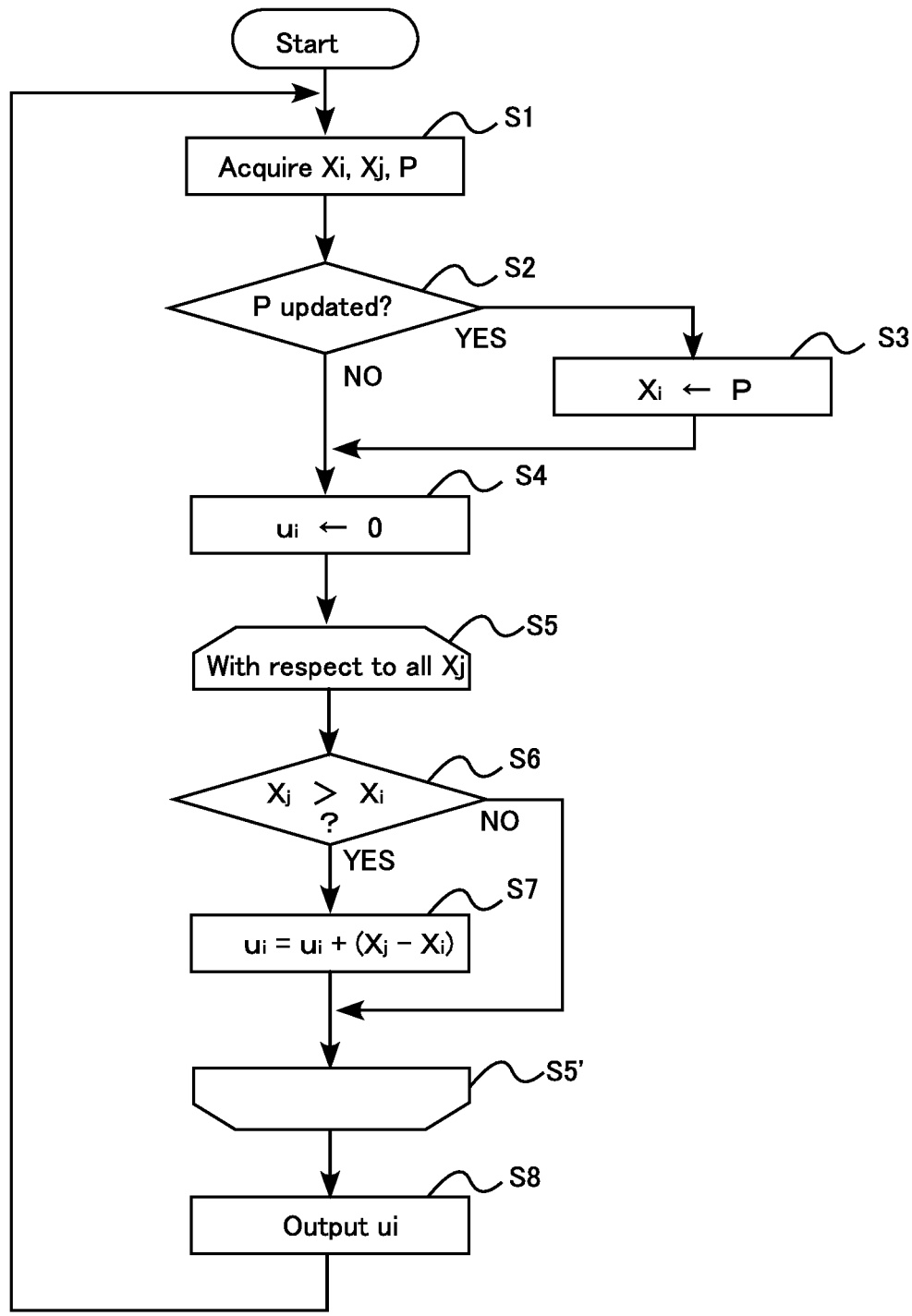
FIG. 16 is a flowchart illustrating computation processing that is performed by a computing unit.

FIG. 16 is a flowchart illustrating the computation processing performed by the computing unit 51a. The execution of the computation processing starts when the measurement apparatus Aa is activated.

First, an internal maximum value $X_i$ previously generated by the maximum value generation unit 5a, an internal maximum value $X_j$ of another measurement apparatus Aa that is input from the communication unit 7a, and an active power P that is input from the active power calculation unit 3a are acquired (S1), and it is determined whether or not the active power P has been updated (S2). If the active power P has been updated (S2: YES), the active power P is input into the internal maximum value $X_i$ (S3). If the active power P has not been updated (S2: NO), the internal maximum value $X_i$ remains and the procedure advances to step S4.

Then, the computation result $u_i$ is initialized to "0" (S4), and steps S6 and S7 are repeated (S5, S5') with respect to all the internal maximum values $X_j$. Only if the internal maximum value $X_j$ is larger than the internal maximum values $X_i$ (S6: YES), the value obtained by subtracting the internal maximum value $X_i$ from the internal maximum value $X_j$ is added to the computation result $u_i$ (S7).

After steps S6 and S7 are repeated with respect to all the internal maximum values $X_j$ (S5, S5'), the computation result $u_i$ is output (S8), and the procedure returns to step S1. Note that the computation processing performed by the computing unit 51a is not limited to the above-described processing. For example, in step S2, if it is determined that the active power P has been updated (S2: YES), it is also possible that the internal maximum value $X_i$ that is output by the integrator 54a serves as the active power P, instead of the active power P is used as the internal maximum value $X_i$ in computation by the computing unit 51a (that is, instead of step S3, the integrator 54a outputs the active power P as the internal maximum value $X_i$ and the procedure returns to step S1).

The multiplier 52a multiplies the computation result $u_i$ that is input from the computing unit 51a by a predetermined coefficient ε, and outputs the product to the integrator 54a. The coefficient ε is a value that satisfies $0<ε<1/d_{max}$, and is preset. $d_{max}$ is determined in the following manner. The number of other measurement apparatuses Aa with which the communication unit 7a of the measurement apparatus $Aa_i$ (i=1, 2, 3, . . . , n) communicates (receives a signal) is $d_i$ (in the example shown in FIG. 14, $d_1$=2 and $d_2$=2). The maximum value of such $d_i$ (i=1, 2, 3, . . . , n) is defined as $d_{max}$. That is, the maximum value is the number of the internal average values $X_j$ that are input into the communication unit 7 of the measurement apparatus that communicates with the largest number of other measurement apparatuses Aa, among the measurement apparatuses Aa. Note that the coefficient ε is used for multiplication of computation result $u_i$ that is to suppress an excessive variation in the internal maximum values $X_i$. Therefore, if the processing by the maximum value generation unit 5a is continuous time processing, there will be no need to provide the multiplier 52a.

The integrator 54a generates and outputs the internal maximum value $X_i$ by integrating the values input from the multiplier 52a (that is, summing up the value that is newly input into a previously generated internal maximum value $X_i$). The internal maximum value $X_i$ is output to the display unit 6a, the communication unit 7a, and the computing unit 51a.

In the present embodiment, the maximum value generation unit 5a generates the internal maximum value $X_i$, using the generated internal maximum value $X_i$ and an internal maximum value $X_j$ of another measurement apparatus Aa that is input from the communication unit 7a. If the internal maximum value $X_i$ is smaller than any one of the internal maximum values $X_j$, the difference is summed up, and the internal maximum value $X_i$ increases. The internal maximum value $X_i$ is approximated to the maximum value of the internal maximum value $X_j$. If the internal maximum value $X_i$ is matched with the maximum value of the internal maximum value $X_j$, the computation result $u_i$ is "0", and the computation result ui does not vary. However, this processing is performed in each measurement apparatus Aa, and thus if there is a larger internal maximum value, any one of the internal maximum values $X_j$ is varied to match its internal maximum value, and the internal maximum value $X_i$ matches its internal maximum value $X_j$. However, the internal maximum values $X_i$ converge to the maximum value of the entire system. If the active power P of the measurement apparatus Aa is updated, the internal maximum value $X_i$ of this measurement apparatus Aa is replaced by the updated active power P, and the internal maximum values $X_i$ of the measurement apparatuses Aa converge to a new maximum value.

Figure 17:
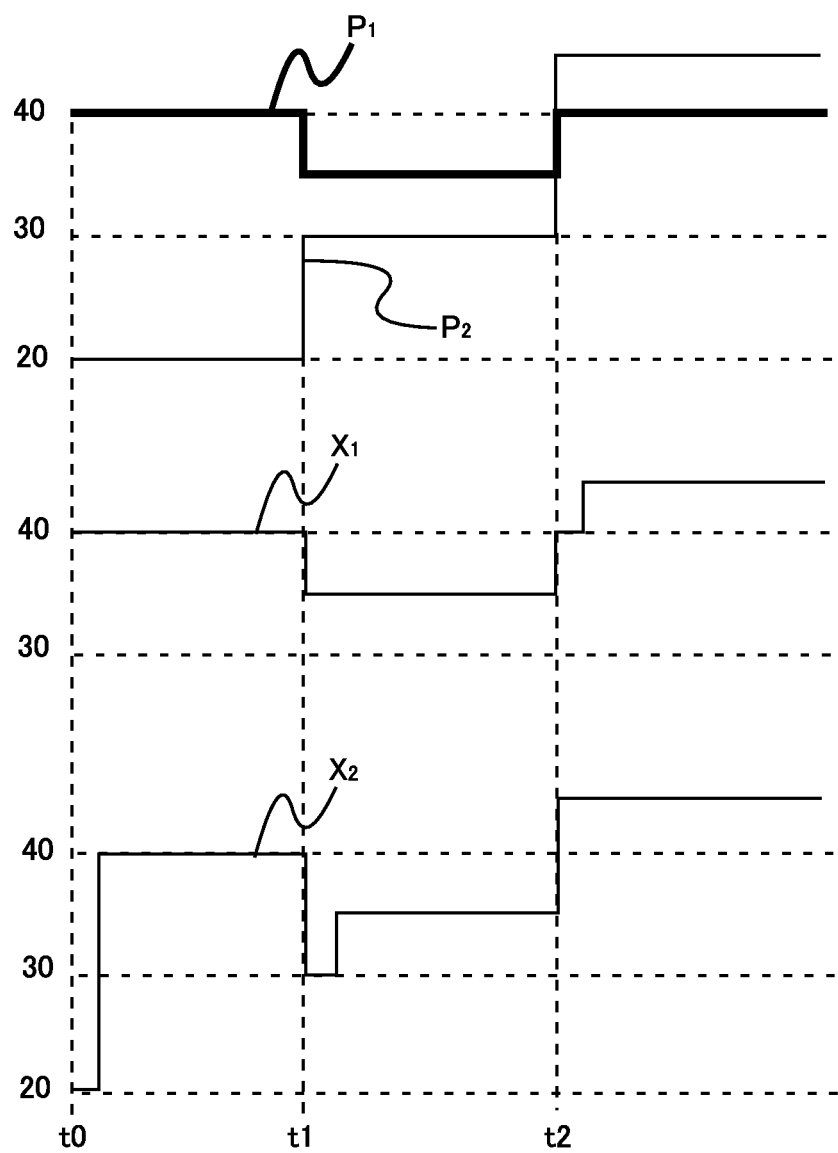
FIG. 17 is a diagram illustrating a change in internal maximum value $X_i$ that was caused by updating of active powers.

FIG. 17 is a diagram illustrating the change of the internal maximum value $X_i$ due to updating of the active power P.

FIG. 17 illustrates the case where the maximum value of two measurement apparatuses Aa1 and Aa2 is calculated. The active powers P measured by the measurement apparatuses Aa1 and Aa2 are respectively defined as $P_1$ and $P_2$, and the internal maximum values generated by the maximum value generation units 5a of the measurement apparatuses Aa1 and Aa2 are respectively defined as $X_1$ and $X_2$. $P_1$ is "40" from time t0 to time t1, is "35" from time t1 to time t2, and is "40" after time t2, and $P_2$ is "20" from time t0 to time t1, is "30" from time t1 to time t2, and is "45" after time t2.

$X_1$ and $X_2$ are respectively "40" and "20" at time t0, but $X_2$ varies soon to "40". Then, since $P_1$ is updated to "35" at time t1, $X_1$ is updated to "35". Furthermore, since $P_2$ is updated to "30", $X_2$ is updated to "30" but varies immediately thereafter to "35". Then, since $P_2$ is updated to "45" at time t2, $X_2$ is updated to "45". Furthermore, since $P_1$ is updated to "40", X1 is updated to "40", but varies immediately thereafter to "45".

The following will describe simulation showing that the maximum values are calculated by the measurement apparatuses Aa1 to Aa5 shown in FIG. 14.

Figure 18A:
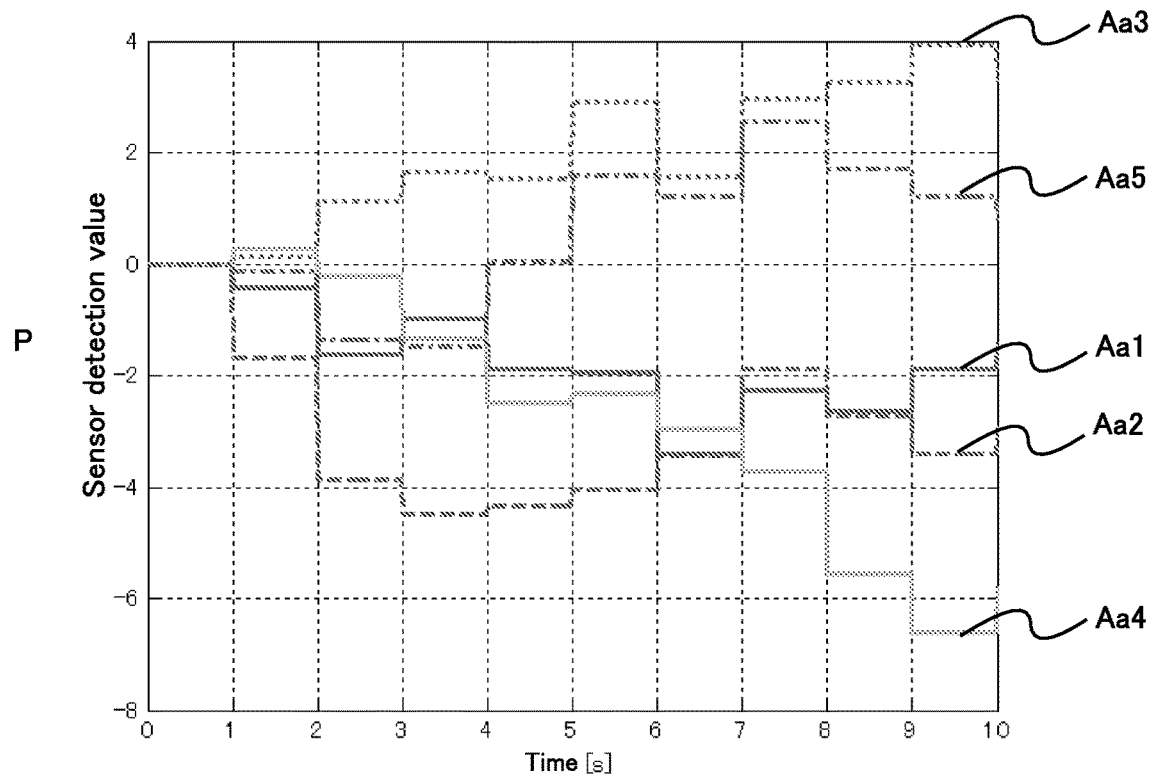
FIGS. 18A and 18B are diagrams illustrating simulation showing that the maximum value is calculated in each measurement apparatus.
Figure 18B:
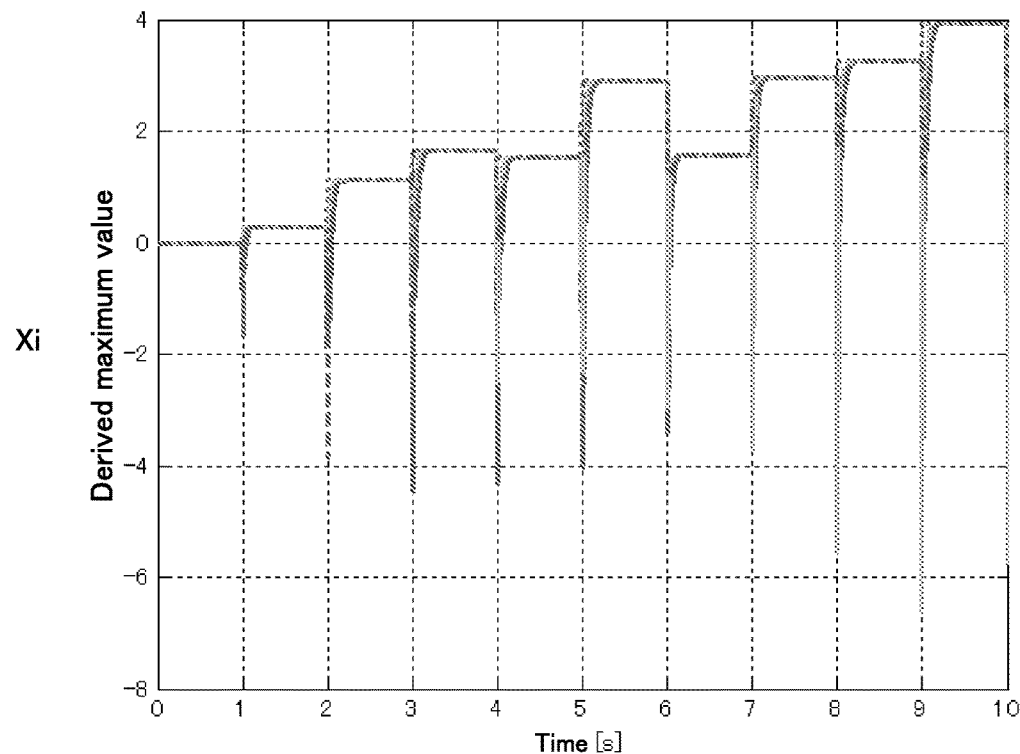

FIGS. 18A and 18B are diagrams illustrating this simulation. FIG. 18A shows the time variation of the active powers P (that is, the measured values) that are output by the active power calculation units 3a of the measurement apparatuses Aa1 to Aa5. Each measured value is varied, using a random number, for each second in a random manner. Furthermore, the communication cycle by the communication unit 7a is 10 milliseconds, and ε is ⅓.

FIG. 18B shows the time variation of the internal maximum values $X_i$ that are output by the maximum value generation units 5a of the measurement apparatuses Aa1 to Aa5. As shown in the drawing, it is recognizable that, at the time of updating of a measured value, the internal maximum values $X_i$ of the measurement apparatuses Aa1 to Aa5 vary transiently but converge to the maximum value. If the display unit 6a is configured to display the internal maximum values $X_i$ only after the stationary state is realized (for example, after 0.1 second or the like since the measured value was updated), the maximum value of the entire system can be displayed.

According to the present embodiment, if the measurement apparatus Aa included in each of the inverter apparatuses installed in the power plant mutually communicates with at least one measurement apparatus Aa (for example, a measurement apparatus that is located in the vicinity thereof or with which communication has been established) and the communication state of the measurement apparatuses Aa is the coupled state, then the internal maximum values $X_i$ of all the measurement apparatuses Aa converge to the same value. The convergence value is the maximum value of the internal maximum values $X_i$ of the measurement apparatuses Aa. Furthermore, if an active power P has been updated, the internal maximum values $X_i$ is replaced by the updated active power P and the internal maximum values $X_i$ converge to a new maximum value. Also if an active power P of another measurement apparatus Aa has been updated, the internal maximum value $X_i$ of this measurement apparatus Aa is replaced by the updated active power P and the internal maximum values $X_i$ of the measurement apparatuses Aa converge to a new maximum value. Accordingly, the maximum value of active powers P of the measurement apparatuses Aa can be calculated using internal maximum values $X_i$. The display unit 6a displays the internal maximum value $X_i$. Accordingly, it is possible to recognize, in each measurement apparatus Aa, the maximum value of output active powers of the entire power plant, without using the monitoring apparatus 103 (see FIG. 23) that collects measured values of the measurement apparatuses.

Note that the foregoing embodiment has described the case where the measurement apparatus Aa calculates the maximum value, but the present invention is not limited to this. For example, it is also possible that the measurement apparatus Aa calculates the minimum value, as will be described below.

In order for the measurement apparatus Aa to calculate the minimum value, computation processing by the computing unit 51a needs only to be modified. Specifically, for example, a minimum value generation unit 5a' is used, instead of the maximum value generation unit 5a, to generate an internal minimum value $Y_i$, using the generated internal minimum value $Y_i$ and an internal minimum value $Y_j$ of another measurement apparatus Aa that is input into the communication unit 7a. Note that the configuration of the measurement apparatus Aa in this case is the same as that shown in FIG. 13, and only the computation processing by the computing unit 51a is modified.

The computing unit 51a of the minimum value generation unit 5a' performs computation based on the following formula (4a). $\beta_{ij}$ is a function that is "1" if $Y_j < Y_i$ is satisfied, and is "0" is $Y_j \geq Y_i$ is satisfied. That is, the computing unit 51a outputs, to the integrator 54a, an obtained computation result $u_i$ that is obtained by subtracting the internal minimum value $Y_i$ generated by the minimum value generation unit 5a' from each of internal minimum values $Y_j$ that are input into the communication unit 7a and summing up all the subtraction results that are a negative value only. However, if the active power P that is input from the active power calculation unit 3a has been varied, the computation result $u_i$ is calculated using, instead of the internal minimum value $Y_i$, the active power P (that is, $Y_i$ is substituted by P in the following formula (4a)).

$$u_i = \sum_j \beta_{ij}(Y_j - Y_i) \quad (4a)$$

The following will describe the simulation showing that the minimum value is calculated in the measurement apparatuses Aa1 to Aa5 shown in FIG. 14.

Figure 19A:
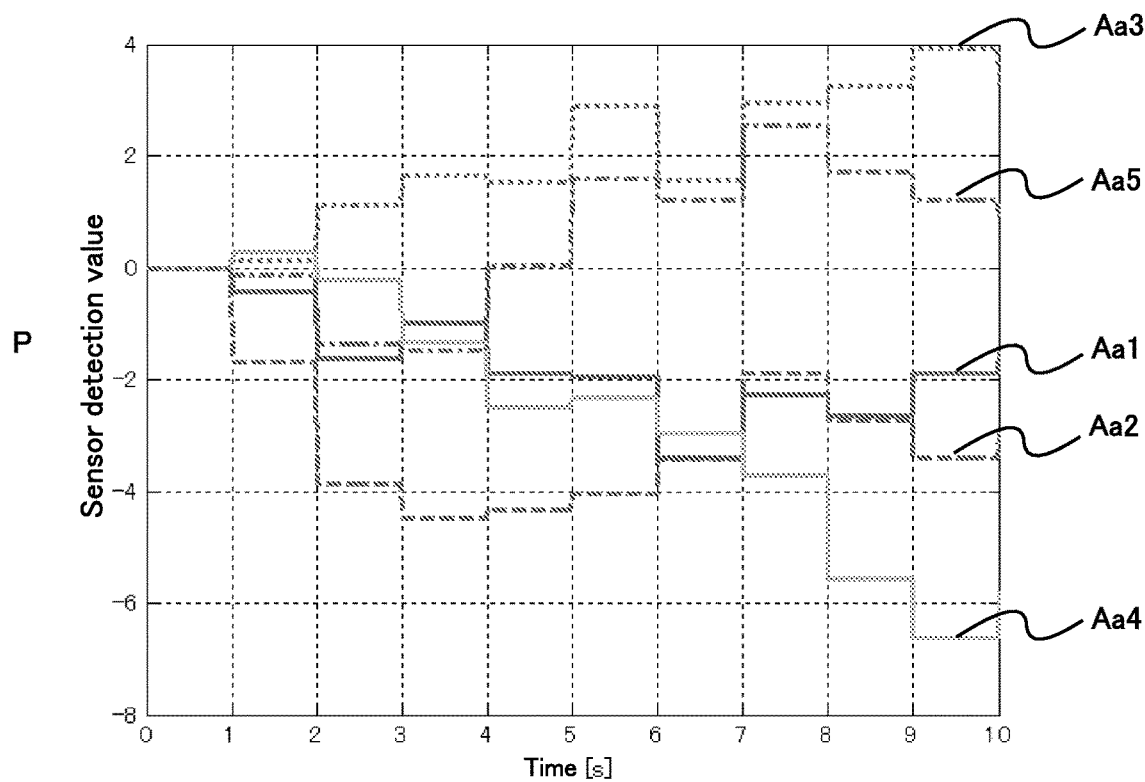
FIGS. 19A and 19B are diagrams illustrating simulation showing that the minimum value is calculated in each measurement apparatus.
Figure 19B:
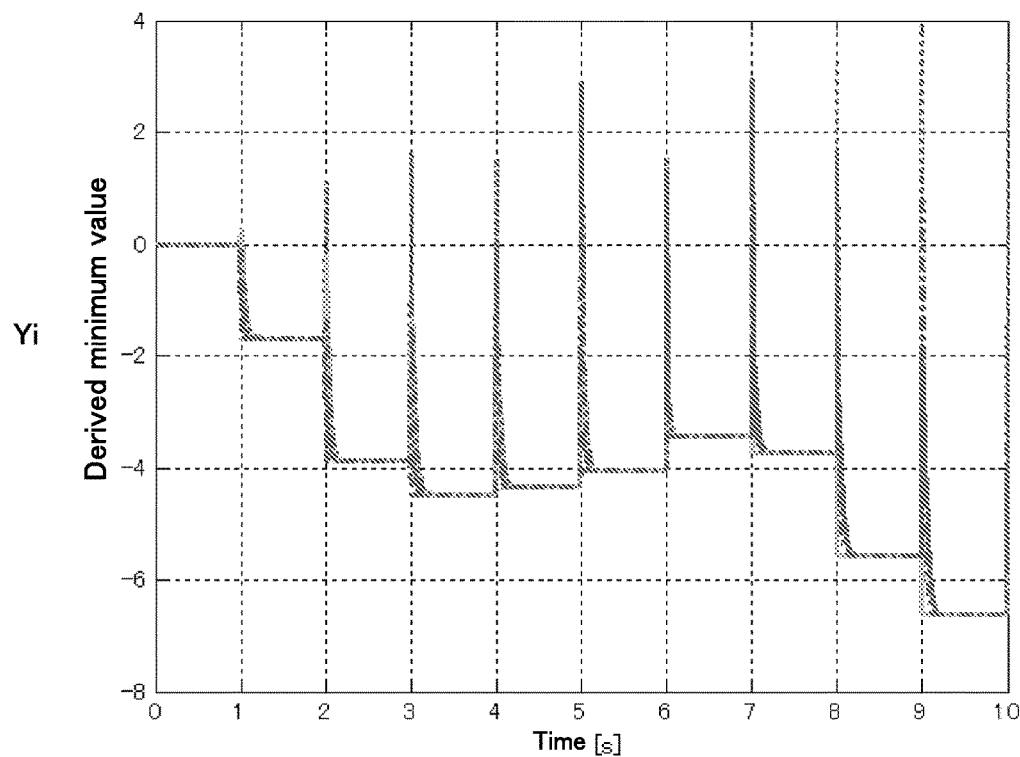

FIGS. 19A and 19B are diagrams illustrating this simulation. FIG. 19A corresponds to FIG. 18A, and shows the time variation of the active powers P (that is, measured values) that are output by the active power calculation units 3a of the measurement apparatuses Aa1 to Aa5.

FIG. 19B shows the time variation of the internal minimum values $Y_i$ that are output by the minimum value generation units 5a' of the measurement apparatuses Aa1 to Aa5. As shown in the drawing, it is recognizable that, at the time of updating of a measured value, the internal minimum values $Y_i$ of the measurement apparatuses Aa1 to Aa5 vary transiently but converge to the minimum value. If the display unit 6a is configured to display the internal minimum value $Y_i$ only after the stationary state is realized (for example, after 0.5 or the like second since the measured value is updated), the minimum value of the entire system can be displayed.

Note that it is also possible to provide both the maximum value generation unit 5a and the minimum value generation unit 5a' in order for the measurement apparatus Aa to calculate the maximum value and the minimum value.

Figure 20:
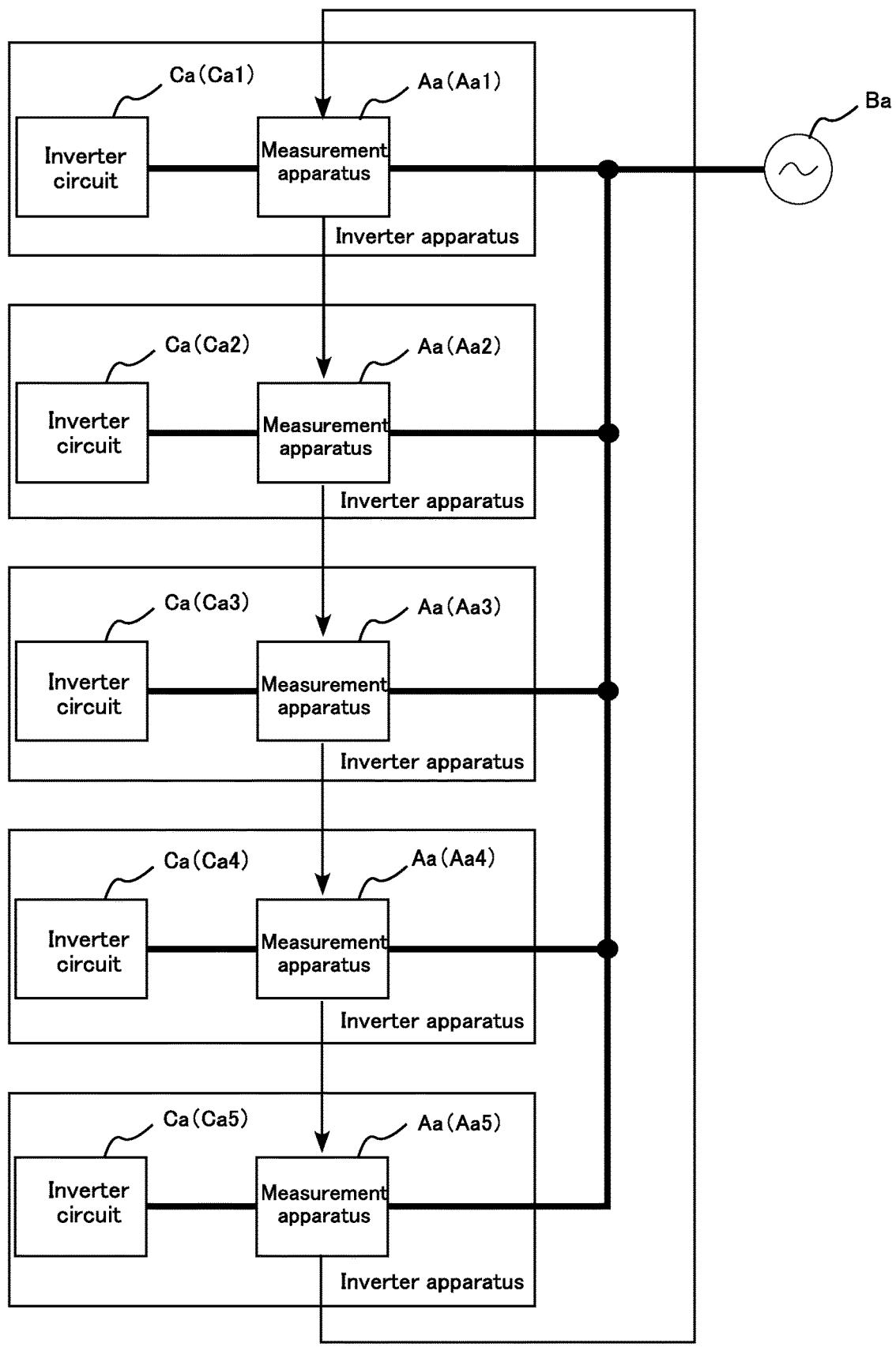
FIG. 20 is a diagram illustrating an example of the communication state between the plurality of measurement apparatuses.

The foregoing embodiment has described the case where each measurement apparatus Aa performs mutual communication, but the present invention is not limited to this, and it is also conceivable that each measurement apparatus Aa performs one-way communication. For example, as shown in FIG. 20, even if the measurement apparatus Aa1 performs reception only from the measurement apparatus Aa5 and transmission only to the measurement apparatus Aa2, the measurement apparatus Aa2 performs reception only from the measurement apparatus Aa1 and transmission only to the measurement apparatus Aa3, the measurement apparatus Aa3 performs reception only from the measurement apparatus Aa2 and transmission only to the measurement apparatus Aa4, the measurement apparatus Aa4 performs reception only from the measurement apparatus Aa3 and transmission only to the measurement apparatus Aa5, and the measurement apparatus Aa5 performs reception only from the measurement apparatus Aa4 and transmission only to the measurement apparatus Aa1, the internal maximum values $X_i$ can converge to the maximum value. More generally speaking, a condition that the internal maximum values $X_i$ converge to the maximum value is a state in which an arbitrary measurement apparatus Aa can be reached by following the transmission destinations from a measurement apparatus Aa (the "strong connectivity" state in the graph algorithm).

In the foregoing embodiment, it is desirable that the generation timings of the internal maximum values $X_i$ in the maximum value generation units 5a of the measurement apparatuses Aa are matched with each other.

If the generation timings of the internal maximum value $X_i$ in the maximum value generation units 5a of the measurement apparatuses Aa are not matched with each other, an error between the convergence value of the internal maximum values $X_i$ and the actual maximum value may be large. Therefore, in order to suppress an occurrence of a large error, the generation timings of the internal maximum value $X_i$ in the maximum value generation units 5a of the measurement apparatuses Aa need to be matched with each other. Examples of the method for matching the generation timings of the internal maximum value $X_i$ include a method using time information of GPS (Global Positioning System). That is, the maximum value generation units 5a of the measurement apparatuses Aa may need only to generate internal maximum values $X_i$ at the same timing, using time information of GPS. As another method, it is also possible for each measurement apparatus Aa to generate a timing phase, and the timing phases are matched with each other. This method will be described below.

Figure 21:
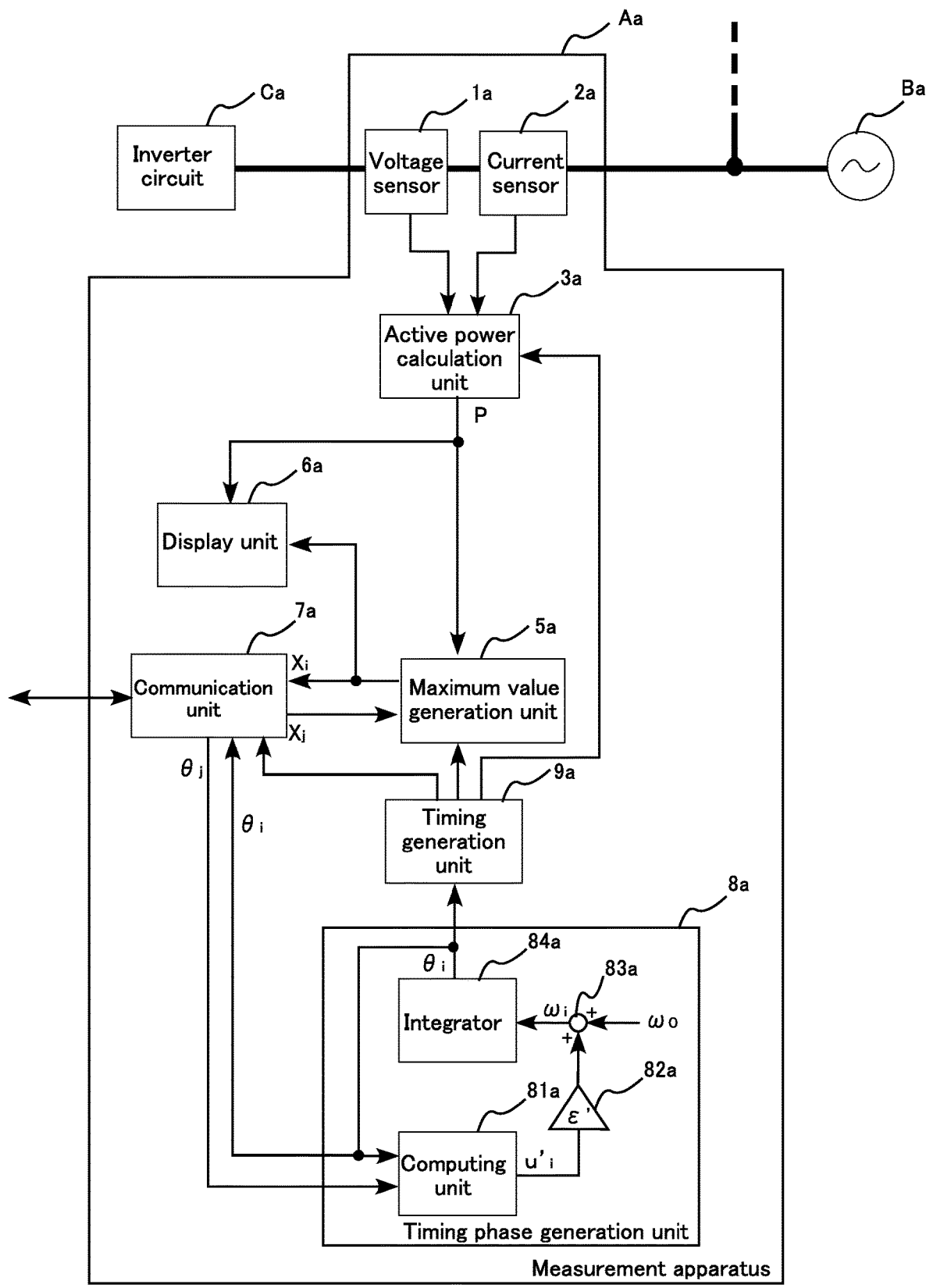
FIG. 21 is a diagram illustrating a measurement apparatus according to a second embodiment of the second aspect of the present invention.

FIG. 21 is a diagram illustrating a measurement apparatus Aa according to a second embodiment of the second aspect of the present invention. In the drawing, the same reference numerals are given to the same or similar components as or to those of the measurement apparatus Aa (see FIG. 13) of the first embodiment. The measurement apparatus Aa according to the second embodiment differs from the measurement apparatus Aa according to the first embodiment in that a timing phase generation unit 8a and a timing generation unit 9a are further included, and the communication unit 7a performs transmission and reception of a timing phase $\theta_j$, in addition to an internal maximum value $X_i$.

The timing phase generation unit 8a generates a timing phase $\theta_i$ for defining a generation timing of the internal maximum value $X_i$ in the maximum value generation unit 5a. The timing phase generation unit 8a outputs the generated timing phase $\theta_i$ to the communication unit 7a and the timing generation unit 9a. The timing phase generation unit 8a generates a new timing phase $\theta_i$ using the generated timing phase $\theta_i$ and a timing phase $\theta_j$ of another measurement apparatus Aa that is input from the communication unit 7a. Even if the generated timing phase $\theta_i$ and the input timing phase $\theta_j$ are different from each other, the timing phase $\theta_i$ and the timing phase $\theta_j$ converge to a common timing phase by computation processing by the timing phase generation unit 8a being repeatedly performed. As shown in FIG. 21, the timing phase generation unit 8a includes a computing unit 81a, a multiplier 82a, an adder 83a, and an integrator 84a.

The computing unit 81a performs computation based on the following formula (5a). That is, the computing unit 81a outputs, to the multiplier 82a, a computation result $u'_i$ that is obtained by subtracting the timing phase $\theta_i$ generated by the timing phase generation unit 8a from each of timing phases $\theta_j$ that are input from the communication unit 7a and summing up all the subtraction results.

$$u'_i = \sum_j (\theta_j - \theta_i) \quad (5a)$$

The multiplier 82a multiplies the computation result $u'_i$ that is input from the computing unit 81a by a predetermined coefficient $\varepsilon'$ and outputs the product to the adder 83a. The coefficient $\varepsilon'$ is a value that satisfies $0<\varepsilon'<1/d_{max}$ and is preset. Note that the coefficient $\varepsilon'$ is used for multiplication of the computation result $u'_i$ that is to suppress an excessive variation in the timing phases $\theta_i$ due to a corrected angular frequency $\omega_i$ becoming excessively large (small). Therefore, if the processing in the timing phase generation unit 8a is continuous time processing, there will be no need to provide the multiplier 82a.

The adder 83a adds the input from the multiplier 82a to a predetermined angular frequency $\omega_0$, and outputs the sum as a corrected angular frequency $\omega_i$ to the integrator 84a. The angular frequency $\omega_0$ corresponds to a timing frequency. The integrator 84a integrates the corrected angular frequency $\omega_i$ that is input from the adder 83a and thereby generates and outputs a timing phase $\theta_i$. The integrator 84a adds the corrected angular frequency $\omega_i$ to a previously generated timing phase $\theta_i$ and thereby generates a timing phase $\theta_i$. Furthermore, the integrator 84a outputs the timing phase $\theta_i$ as a value in the range of $-\pi<\theta_i\leq\pi$. Note that the method for setting the range of the timing phase $\theta_i$ is not limited to this, and the range may also be, for example, $0\leq\theta_i<2\pi$. The timing phase $\theta_i$ is output to the timing generation unit 9a, the communication unit 7a, and the computing unit 81a.

In the second embodiment, the timing phase generation unit 8a generates a timing phase $\theta_i$, using the generated timing phase $\theta_i$ and a timing phase $\theta_j$ of another measurement apparatus Aa that is input from the communication unit 7a. If the timing phase $\theta_i$ is larger than the arithmetic average value of timing phases $\theta_j$, the computation result $u'_i$ that is output by the computing unit 81a will be a negative value. Accordingly, the corrected angular frequency $\omega_i$ is smaller than the predetermined angular frequency $\omega_0$, and the change amount in the timing phase $\theta_i$ decreases. On the other hand, if the timing phase $\theta_i$ is smaller than the arithmetic average value of the timing phases $\theta_j$, the computation result $u'_i$ that is output by the computing unit 81a will be a positive value. Accordingly, the corrected angular frequency $\omega_i$ is larger than the angular frequency $\omega_0$, and the change amount in the timing phase $\theta_i$ increases. That is, the timing phase $\theta_i$ is approximated to the arithmetic average value of the timing phases $\theta_j$. This processing is performed in each measurement apparatus Aa, and thereby the timing phases $\theta_i$ of the measurement apparatuses Aa converge to the same value. More specifically, the timing phase $\theta_i$ varies with time but it is conceivable that the timing phase $\theta_i$ is a phase obtained by combining a component that varies with the angular frequency $\omega_0$ and a component that varies so as to compensate shifting of initial phases. The latters converge to the same value $\theta\alpha$, and thereby the timing phases $\theta_i$ of the measurement apparatuses Aa converge to the same value. The fact that the latters converge to the same value $\theta\alpha$ is also mathematically proofed (see Non-Patent Documents 1 and 2). Furthermore, the fact that, as indicated by the following formula (6a), the convergence value $\theta\alpha$ is the arithmetic average value of the initial values of the timing phases $\theta_i$ of the measurement apparatuses Aa is also proofed. n refers to the number of the inverter apparatuses installed in an power plant (that is, the number of the measurement apparatuses Aa), and the following formula (6a) indicates that an arithmetic average value is calculated by summing up the initial values of the timing phases $\theta_1$ to $\theta_n$ of the measurement apparatuses $Aa_1$ to $Aa_n$ and dividing the sum by n.

$$\theta_\alpha = \frac{1}{n}\sum_{i=1}^{n} \theta_i(0) \quad (6a)$$

Note that the second embodiment describes the case where a cycle T of the processing by the timing phase generation unit 8a is 1 second. If the cycle T is, for example, 0.1 second, a value to which the input from the multiplier 82a is added by the adder 83a is a value obtained by multiplying the angular frequency $\omega_0$ by $\frac{1}{10}$. That is, $T\omega_0$, instead of $\omega_0$, is input.

The timing generation unit 9a outputs a timing signal for instructing a generation timing of the internal maximum value $X_i$ to the maximum value generation unit 5a. The timing generation unit 9a outputs a timing signal based on the timing phase $\theta_i$ input from the timing phase generation unit 8a. For example, a timing signal is output at a timing at which the timing phase $\theta_i$ is "0", for example. Note that the timing at which a timing signal is output is not limited to this. Furthermore, it is also possible that a timing signal is output at a timing at which the number of times when the timing phase $\theta_i$ is "0" is a scheduled number of times. Furthermore, the timing generation unit 9a also outputs timing signals whose frequency is divided according to respective processing cycles to the active power calculation unit 3a and the communication unit 7a.

According to the second embodiment, since each measurement apparatus Aa mutually communicates with at least one measurement apparatus Aa and the communication state of the measurement apparatuses Aa is the coupled state, the timing phases $\theta_i$ of all the measurement apparatuses Aa converge to the same value. Accordingly, the generation timings of the internal maximum value $X_i$ can be matched with each other in the maximum value generation units 5a of the respective measurement apparatuses Aa. Therefore, the measurement apparatuses Aa can converge the internal maximum values $X_i$ to the actual maximum value with accuracy. Furthermore, timings at which an active power is calculated by the active power calculation units 3a of the measurement apparatuses Aa can be matched with each other, and timings at which communication is performed by the communication units 7a thereof can be matched with each other.

The second embodiment has described the case where the component that varies so as to compensate shifting of initial phases of the timing phases $\theta_i$ to the predetermined value (arithmetic average value of the initial values of the timing phases $\theta_i$ of the measurement apparatuses Aa), but the present invention is not limited to this. The convergence value $\theta\alpha$ can be changed depending on the computing equation set for the computing unit 81a.

For example, in the case where the computing equation set for the computing unit 81a is the following formula (7a), the convergence value $\theta\alpha$ is a value as shown in the following formula (8a). $d_i$ refers to the number of other measurement apparatuses Aa with which the communication unit 7 communicates (the number of the timing phases $\theta_j$ that are input into the communication unit 7a). The convergence value $\theta\alpha$ in this case is a weighted average value of the initial values of the timing phases $\theta_i$ of the measurement apparatuses Aa, the weighted average value being weighted by the number of communication partners.

$$u'_i = \frac{1}{d_i} \sum_j (\theta_j - \theta_i) \tag{7a}$$

$$\theta_\alpha = \frac{\sum_{i=1}^{n} d_i \theta_i(0)}{\sum_{i=1}^{n} d_i} \tag{8a}$$

Furthermore, in the case where the computing equation that is set for the computing unit 81a is the following formula (9a), the convergence value $\theta\alpha$ is, as shown in the following formula (10a), a geometric average value of the initial values of the timing phases $\theta_i$ of the measurement apparatuses Aa.

$$u'_i = \theta_i \sum_j (\theta_j - \theta_i) \tag{9a}$$

$$\theta_\alpha = \sqrt[n]{\prod_{i=1}^{n} \theta_i(0)} \tag{10a}$$

Furthermore, in the case where the computing equation that is set for the computing unit 81a is the following formula (11a), the convergence value $\theta\alpha$ is, as shown in the following formula (12a), a harmonic average value of the initial values of the timing phases $\theta_i$ of the measurement apparatuses Aa.

$$u'_i = \theta_i^2 \sum_j (\theta_i - \theta_j) \tag{11a}$$

$$\theta_\alpha = \frac{n}{\sum_{i=1}^{n} \frac{1}{\theta_i(0)}} \tag{12a}$$

Furthermore, in the case where the computing equation that is set for the computing unit 81a is the following formula (13a), the convergence value $\theta\alpha$ is, as shown in the following formula (14a), a P-th order average value of the initial values of the timing phases $\theta_i$ of the measurement apparatuses Aa.

$$u'_i = \frac{1}{P\theta_i^{P-1}} \sum_j (\theta_j - \theta_i) \tag{13a}$$

$$\theta_\alpha = \sqrt[P]{\sum_{i=1}^{n} \frac{1}{n} \theta_i(0)^P} \tag{14a}$$

Furthermore, it is also possible to use an algorithm for calculating the maximum value (or the minimum value) that was explained with reference to the computing unit 51a according to the above-described first embodiment to define the convergence value $\theta\alpha$ as the maximum value (or the minimum value) of the initial values of the timing phases $\theta_i$ of the measurement apparatuses Aa.

In the case where the computing equation that is set for the computing unit 81a is the following formula (15a), the convergence value $\theta\alpha$ is the maximum value of the initial values of the timing phases $\theta_i$ of the measurement apparatuses Aa. Note that $\alpha_{ij}$ is a function that is "1" if $\theta_j > \theta_i$ is satisfied and is "0" if $\theta_j \le \theta_i$ is satisfied.

$$u'_i = \sum_j \alpha_{ij}(\theta_j - \theta_i) \tag{15a}$$

Similarly, if the computing equation that is set for the computing unit 81a is the following formula (16a), the convergence value $\theta\alpha$ is the minimum value of the initial values of the timing phases $\theta_i$ of the measurement apparatuses Aa. Note that $\beta_{ij}$ is a function that is "1" if $\theta_j < \theta_i$ is satisfied and is "0" if $\theta_j \ge \theta_i$ is satisfied.

$$u'_i = \sum_j \beta_{ij}(\theta_j - \theta_i) \tag{16a}$$

Accordingly, the above-described algorithm for calculating the maximum value (or the minimum value) can be used not only for calculating the maximum value (or the minimum value) but also for matching phases, timings, other internal values, or the like.

The first and second embodiment have described the case where a measurement apparatus Aa calculates the maximum value (or the minimum value) of output active powers, but the present invention is not limited to this. For example, by configuring such that the active power calculation unit 3a calculate reactive powers instead of active powers, the measurement apparatus Aa can function as a reactive power measurement apparatus that can calculate the maximum value (or the minimum value) of output reactive powers. Furthermore, it is also possible to measure output voltages or output currents of the inverter circuit Ca to calculate the maximum value (or the minimum value) thereof, or it is also possible to measure input powers, input voltages, and input currents from solar cells connected to the inverter circuit Ca to calculate the maximum value (or the minimum value) thereof. Furthermore, it is also possible to detect voltage phases or frequencies from voltage signals to calculate the maximum value (or the minimum value) thereof. Furthermore, it is also possible to measure the solar radiation intensities and the amounts of solar radiation to solar cells, the temperature of the solar cells, or the like to calculate the maximum value (or the minimum value) thereof. Moreover, it is also possible to calculate the maximum value (or the minimum value) of some or all of these measured values.

The foregoing first and second embodiments have described the case where the measurement apparatuses Aa are included in the inverter apparatuses connected to solar cells, but the present invention is not limited to this. For example, the present invention is applicable to measurement apparatuses that are included in inverter apparatuses installed in a wind power plant. In this case, the wind speeds and the wind amounts may be measured, and the maximum value (or the minimum value) thereof may be calculated. Furthermore, the present invention is also applicable to a measurement apparatus that is arranged on an electric distribution line or feeder line of an electric power system or an outlet at home or building and measures electric information (voltage, current, electric power, and the like). Furthermore, the present invention is also applicable to a measurement apparatus that measures electric information of an output of a fuel battery, a rechargeable battery, a diesel engine generator, a micro gas turbine generator, and the like.

Furthermore, the present invention is also applicable to a measurement apparatus that measures information (such as an atmosphere pressure, a flow rate, and a weight, in addition to the above-described temperature, solar radiation intensity, amount of solar radiation, wind speed, and wind amount) other than electric information. The case where the measurement apparatus Aa functions as a temperature measurement apparatus will be described as a third embodiment of the second aspect of the present invention below.

Figure 22:
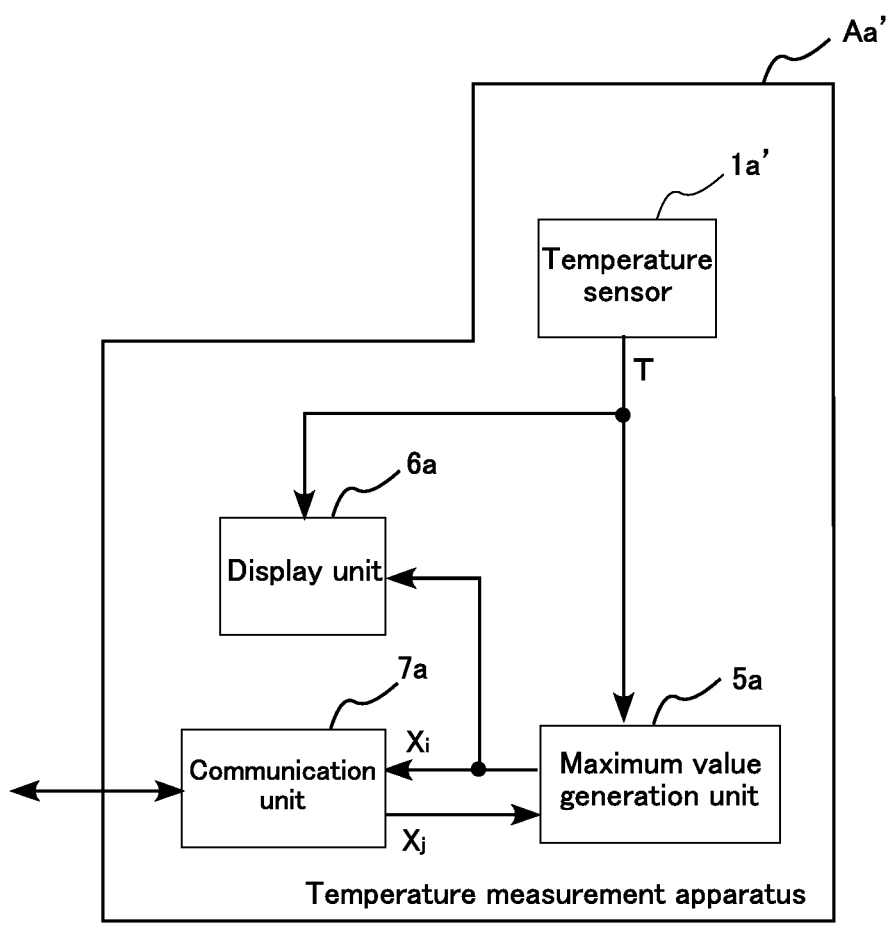
FIG. 22 is a diagram illustrating a temperature measurement apparatus according to a third embodiment of the second aspect of the present invention.

FIG. 22 is a diagram illustrating a measurement apparatus (temperature measurement apparatus) Aa' according to the third embodiment of the second aspect. In the drawing, the same reference numerals are given to the same or similar components as or to those of the measurement apparatus Aa (see FIG. 13) according to the first embodiment. The temperature measurement apparatus Aa' according to the third embodiment differs from the measurement apparatus Aa according to the first embodiment in being provided with a temperature sensor 1a', instead of the voltage sensor 1a, the current sensor 2a, and the active power calculation unit 3a.

The temperature sensor 1a' detects a temperature T at the position at which temperature sensor 1a' is arranged, and uses, for example, a thermistor or a thermocouple. The detected temperature T is output to the maximum value generation unit 5a and the display unit 6a. The maximum value generation unit 5a generates an internal maximum value $X_i$, and performs transmission and reception to and from another temperature measurement apparatus Aa' via the communication unit 7a.

Also in the third embodiment, each temperature measurement apparatus Aa' mutually communicates with at least one temperature measurement apparatus Aa', and if the communication state of the temperature measurement apparatuses Aa' is the coupled state, the internal maximum values $X_i$ of all the temperature measurement apparatus Aa' can converge to an actual maximum value. Accordingly, the maximum value of the temperatures measured by the temperature measurement apparatuses Aa' can be displayed on the display unit 6a.

The first to third embodiments have described the case where a measurement apparatus Aa uses an algorithm for calculating the maximum value (or the minimum value), but the present invention is not limited to this. This algorithm (a method for calculating the maximum value or the minimum value) may also be used for another apparatus. For example, in each inverter apparatus in a solar power plant, this algorithm may also be used by the control circuit for controlling the inverter circuit, and output active powers of the inverter apparatuses can be controlled to be the maximum active power. Furthermore, this algorithm may also be used for, instead of calculating the maximum value (or the minimum value), matching phases, timings, other internal values, or the like. For example, this algorithm may also be used in the control circuits of the inverter apparatuses in the solar power plant, to synchronize internal phases of the control circuits.

The measurement apparatus and calculation method according to the second aspect of the present invention are not limited to the above-described embodiments, and variety of design modifications are applicable to specific configurations of the components.

The invention claimed is:

1. A measurement apparatus that cooperates with at least one other measurement apparatus, comprising:
an internal value generator for generating a first internal value based on a measured value; and
a communication unit for receiving a second internal value generated by the at least one other measurement apparatus;
wherein the internal value generator is configured to generate a third internal value, based on at least one of the first internal value, the second internal value, and the measured value,
if the measured value is not varied, the first internal value and the second internal value are used for the generation of the third internal value, and
if the measured value is varied to another measured value, at least said another measured value is used for the generation of the third internal value,
wherein the internal value generator includes:
a computing unit for performing computation based on the first internal value and the second internal value; and
an integrating unit for calculating the third internal value based on a computation result that is output by the computing unit, wherein the computing unit is configured to subtract the first internal value from the second internal value, and to use, if a subtraction result is a positive value, the positive value for calculation of the computation result, and not to use, if a subtraction result is a non-positive value, the non-positive value for calculation of the computation result.

2. The measurement apparatus according to claim 1, wherein if the measured value is varied to another measured value, said another measured value and the second internal value are used for the generation of the third internal value.

3. The measurement apparatus according to claim 1, further comprising a display unit for displaying the internal values generated by the internal value generator.

4. The measurement apparatus according to claim 1, further comprising a timing matching unit for synchronizing the at least one other measurement apparatus with respect to a timing at which the internal value is generated.

5. The measurement apparatus according to claim 4, wherein the timing matching unit includes a timing phase generator for generating a timing phase, and
the timing phase generator generates a new timing phase, using a computation result based on the generated timing phase and a timing phase received from the at least one other measurement apparatus.

6. The measurement apparatus according to claim 1, further comprising: a voltage sensor configured to detect a voltage; a current sensor configured to detect a current; and
an active power calculator for calculating an active power based on the detected voltage and the detected current.

7. The measurement apparatus according to claim 1, further comprising a temperature sensor.

8. A measurement apparatus that cooperates with at least one other measurement apparatus, comprising:
an internal value generator for generating a first internal value based on a measured value; and
a communication unit for receiving a second internal value generated by the at least one other measurement apparatus;
wherein the internal value generator is configured to generate a third internal value, based on at least one of the first internal value, the second internal value, and the measured value,
if the measured value is not varied, the first internal value and the second internal value are used for the generation of the third internal value, and
if the measured value is varied to another measured value, at least said another measured value is used for the generation of the third internal value,
wherein if the measured value is varied to another measured value, said another measured value is output as the third internal value from the internal value generator.

9. The measurement apparatus according to claim 8, further comprising a display unit for displaying the internal values generated by the internal value generator.

10. The measurement apparatus according to claim 8, further comprising a timing matching unit for synchronizing the at least one other measurement apparatus with respect to a timing at which the internal value is generated.

11. The measurement apparatus according to claim 8, further comprising: a voltage sensor configured to detect a voltage; a current sensor configured to detect a current; and an active power calculator for calculating an active power based on the detected voltage and the detected current.

12. The measurement apparatus according to claim 8, further comprising a temperature sensor.

13. A measurement apparatus that cooperates with at least one other measurement apparatus, comprising:
an internal value generator for generating a first internal value based on a measured value; and
a communication unit for receiving a second internal value generated by the at least one other measurement apparatus;
wherein the internal value generator is configured to generate a third internal value, based on at least one of the first internal value, the second internal value, and the measured value,
if the measured value is not varied, the first internal value and the second internal value are used for the generation of the third internal value, and
if the measured value is varied to another measured value, at least said another measured value is used for the generation of the third internal value,
wherein the internal value generator includes:
a computing unit for performing computation based on the first internal value and the second internal value; and
an integrating unit for calculating the third internal value based on a computation result that is output by the computing unit,
wherein the computing unit is configured to subtract the first internal value from the second internal value, and to use, if a subtraction result is a negative value, the negative value for calculation of the computation result, and not to use, if a subtraction result is a non-negative value, the non-negative value for calculation of the computation result.

14. The measurement apparatus according to claim 13, further comprising a display unit for displaying the internal values generated by the internal value generator.

15. The measurement apparatus according to claim 13, further comprising a timing matching unit for synchronizing the at least one other measurement apparatus with respect to a timing at which the internal value is generated.

16. The measurement apparatus according to claim 13, further comprising: a voltage sensor configured to detect a voltage; a current sensor configured to detect a current; and an active power calculator for calculating an active power based on the detected voltage and the detected current.

17. The measurement apparatus according to claim 13, further comprising a temperature sensor.

18. A calculation method for calculating a maximum value or minimum value of measured values measured by a plurality of measurement apparatuses arranged at a plurality of positions, the method comprising the steps of:
each of the plurality of measurement apparatuses generating a first internal value based on a measured value;
transmitting the first internal value to at least one other measurement apparatus;
receiving a second internal value transmitted by the at least one other measurement apparatus; and
generating a third internal value, based on at least one of the first internal value, the second internal value, and the measured value;
wherein if the measured value is not varied, the first internal value and the second internal value are used for the generation of the third internal value, and
if the measured value is varied to another measured value, at least said another measured value is used for the generation of the third internal value,
the calculation method further comprising the step of subtracting the first internal value or said another measured value from the second internal value, wherein if a subtraction result is a positive value, the third internal value is generated by integrating a computed value including at least the positive value.

19. A calculation method for calculating a maximum value or minimum value of measured values measured by a plurality of measurement apparatuses arranged at a plurality of positions, the method comprising the steps of:

each of the plurality of measurement apparatuses generating a first internal value based on a measured value;

transmitting the first internal value to at least one other measurement apparatus;

receiving a second internal value transmitted by the at least one other measurement apparatus; and generating a third internal value, based on at least one of the first internal value, the second internal value, and the measured value;

wherein if the measured value is not varied, the first internal value and the second internal value are used for the generation of the third internal value, and if the measured value is varied to another measured value, at least said another measured value is used for the generation of the third internal value, the method further comprising the step of subtracting the first internal value or said another measured value from the second internal value, wherein if a subtraction result is a negative value, the third internal value is generated by integrating a computed value including at least the negative value.

* * * * *